(12) United States Patent
Tyminski

(10) Patent No.: US 10,488,763 B2
(45) Date of Patent: Nov. 26, 2019

(54) PATTERN-EDGE PLACEMENT PREDICTOR AND MONITOR FOR LITHOGRAPHIC EXPOSURE TOOL

(71) Applicant: NIKON CORPORATION, Tokyo (JP)

(72) Inventor: Jacek K. Tyminski, Mountain View, CA (US)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 16/417,210

(22) Filed: May 20, 2019

(65) Prior Publication Data

US 2019/0278189 A1   Sep. 12, 2019

Related U.S. Application Data

(63) Continuation of application No. 16/014,399, filed on Jun. 21, 2018, now Pat. No. 10,345,715, which is a continuation-in-part of application No. 15/014,677, filed on Feb. 3, 2016, now Pat. No. 10,018,922, which is a continuation-in-part of application No. PCT/US2015/048037, filed on Sep. 2, 2015.

(60) Provisional application No. 62/164,435, filed on May 20, 2015, provisional application No. 62/112,423, filed on Feb. 5, 2015, provisional application No. 62/044,777, filed on Sep. 2, 2014.

(51) Int. Cl.
   *G03F 7/20* (2006.01)
   *G06T 7/73* (2017.01)

(52) U.S. Cl.
   CPC .......... *G03F 7/70633* (2013.01); *G03F 7/705* (2013.01); *G03F 7/70058* (2013.01); *G03F 7/70125* (2013.01); *G03F 7/70258* (2013.01); *G03F 7/70625* (2013.01); *G06T 7/73* (2017.01); *G06T 2207/30148* (2013.01)

(58) Field of Classification Search
   CPC .. G03F 7/70633; G03F 7/70258; G03F 7/705; G03F 7/70125; G03F 7/70625; G03F 7/73; G03F 7/70058
   USPC ................................. 430/5, 22, 30
   See application file for complete search history.

(56) References Cited

U.S. PATENT DOCUMENTS

| | | | |
|---|---|---|---|
| 6,430,737 B1 | 8/2002 | Cobb et al. | |
| 7,111,277 B2 | 9/2006 | Ye | |
| 7,181,707 B2 | 2/2007 | Kotani et al. | |
| 7,281,222 B1 | 10/2007 | Babcock | |
| 7,788,626 B2 | 8/2010 | Nojima et al. | |
| 7,808,613 B2 | 10/2010 | Lof | |
| 8,203,696 B2 | 6/2012 | Bittner et al. | |
| 8,365,107 B2 | 1/2013 | Tyminski et al. | |
| 8,570,485 B2 | 10/2013 | Ye et al. | |
| 8,711,239 B2 | 4/2014 | Nitta et al. | |
| 8,806,387 B2 | 8/2014 | Cao et al. | |
| 8,856,694 B2 | 10/2014 | Ye et al. | |
| 2012/0331427 A1 | 12/2012 | Tyminski | |

OTHER PUBLICATIONS

Wakamatsu, G., et al., "Double patterning process with freezing technique," Proc. SPIE, vol. 7273, 72730B (2009), and references therein.
Koay, C.S., et al., "Evaluation of double-patterning techniques for advanced logic nodes," Proc. SPIE 7640, 764009 (2010).
Lai, K., et al., "32nm logic patterning options with immersion lithography," Proc. SPIE 6924, 69243C (2008).
Hazelton, A.J., et al., "Achieving overlay budgets for double patterning," Proc. SPIE, vol. 7274, 72740X (2009).
Tyminski, J.K., et al., "Scanner-dependent Optical Proximity Effects", Proc. SPIE 7274, 7274-29 (2009).
Tyminski, J.K., et al., "The Impact of Illuminator Signatures on Optical Proximity Effects", Proc. SPIE 7140, 7140-81 (2008).
Tyminski, J.K., et al., "Polarization Dependent Proximity Effects", Proc. SPIE 6520, 6520-14 (2007).
Erdmann, A., "Topography effects and wave aberrations in advanced PSM technology," Proc. SPIE 4346, 4346-345 (2001).
Progler, C., et al., "Method to Budget and Optimize Total Device Overlay", Proc. SPIE vol. 3679, pp. 193-207 (1999).
Mulkens, J., et al., "Holistic optimization architecture enabling sub-14-nm projection lithography", Proc. SPIE vol. 13(1), pp. 011006-1-011006-10 (2014).

*Primary Examiner* — Christopher G Young
(74) *Attorney, Agent, or Firm* — Yakov Sidorin; Quarles & Brady LLP

(57) ABSTRACT

Method and system configured to reduce or even nullify the degradation of images created by the projector tool turns on the optimization of the pattern-imaging by adjusting parameters and hardware of the projector to judiciously impact the placement of various image edges at different locations in the image field. Adjustments to the projector (exposure tool) include a change of a setup parameter of the exposure tool and/or scanning synchronization and/or a change of a signature of the optical system of the exposure tool determined as a result of minimizing the pre-determined cost function(s) that are parts of a comprehensive edge-placement error model.

27 Claims, 13 Drawing Sheets

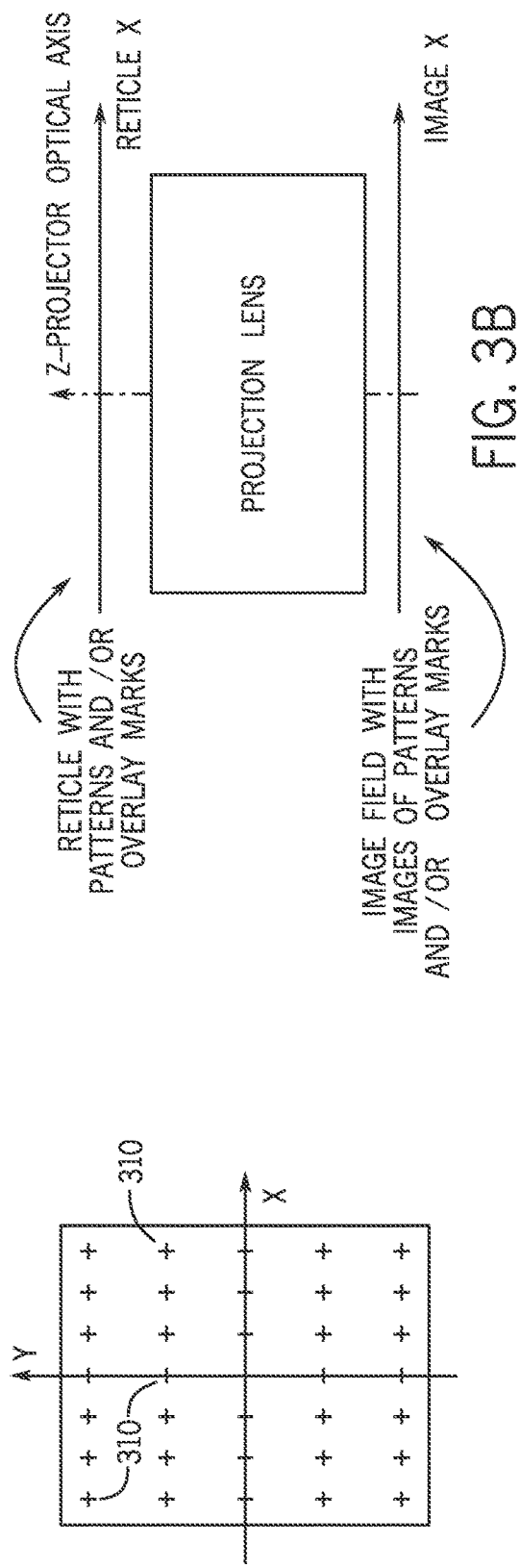
FIG. 3A
FIG. 3B
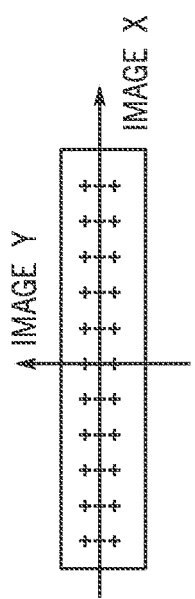
FIG. 3C

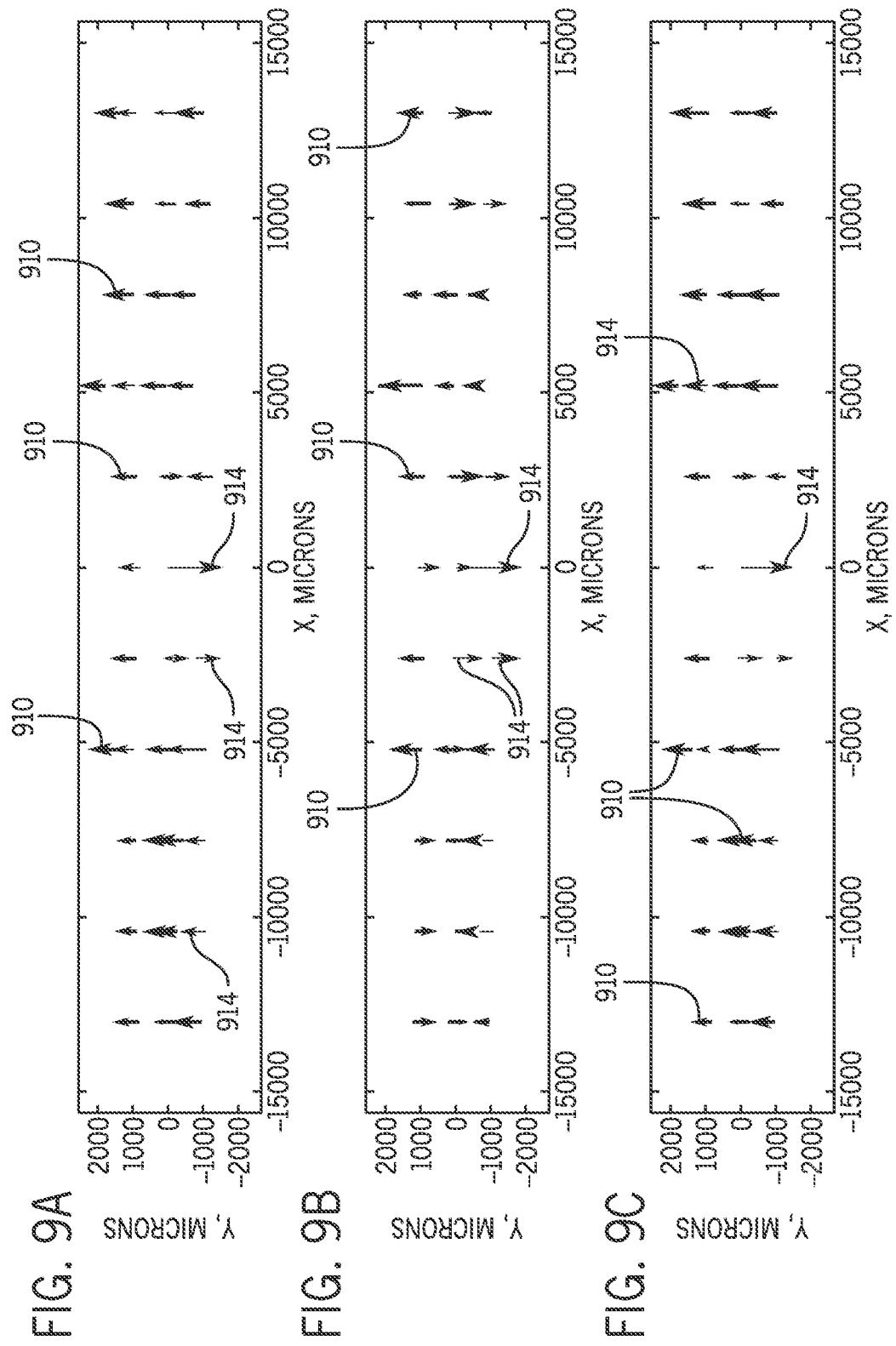

PATTERN-EDGE PLACEMENT PREDICTOR AND MONITOR FOR LITHOGRAPHIC EXPOSURE TOOL

CROSS-REFERENCE TO RELATED APPLICATIONS

The present application is a continuation from the U.S. patent application Ser. No. 16/014,399 filed on Jun. 21, 2018 and now published as US 2018/0299795, which is a continuation-in-part from the U.S. patent application Ser. No. 15/014,677 filed on Feb. 3, 2016 and now U.S. Pat. No. 10,018,922, which claims priority from the U.S. provisional patent application No. 62/112,423 filed on Feb. 5, 2015. The U.S. patent application Ser. No. 15/014,677 also claims priority from and benefit of the U.S. provisional patent application No. 62/164,435 filed on May 20, 2015. The U.S. patent application Ser. No. 15/014,677 is also a continuation-in-part from the international application no. PCT/US2015/048037 filed on Sep. 2, 2015, which in turn claims priority from the U.S. provisional patent application No. 62/044,777, filed on Sep. 2, 2014. The disclosure of each of the above-identified patent documents is incorporated by reference herein.

TECHNICAL FIELD

The present invention relates generally to modification of a hardware of a lithographic exposure tool to vary the placement of image pattern(s) formed on a target substrate and, more particularly, to the process of adjustment of element(s) of a projection optical system of the exposure tool to achieve precise locations of such patterns and the pattern edges that have been predefined as a result of optimization of the image-edge placement.

BACKGROUND

Photolithography is a process commonly used for defining features during semiconductor wafer processing, for example during the fabrication of integrated devices (and, in a specific case, integrated circuits or ICs), micro electromechanical systems (MEMS), or micro opto-electro-mechanical systems (MOEMS), collectively referred to herein as integrated devices. Photolithography generally involves applying a photoresist material ("resist") to a wafer, irradiating the resist using chosen radiation (for example, light) the spatial distribution of which is appropriately patterned, then developing the patterned resist, etching a material of the wafer or depositing different materials on the parts of wafer exposed in the patterned resist, and, finally, removing the remaining resist after etching or deposition of the materials. In photolithography, a critical dimension (CD) is a characteristic size that corresponds to various features critical to the integrated device performance that need to be patterned on a chosen surface (such as the wafer surface, for example), e.g., a target feature width, length and/or spacing between features.

The process of integrated device fabrication involves multiple steps of resist patterning followed by wafer etching or materials deposition. During such fabrication process, patterns are laid down on a reticle, the image of which is later formed with a photolithography tool on a target substrate (such as a semiconductor wafer) in a sequence of patterning steps. The formation of an image of the reticle is followed by the process of formation (which may include the etch and/or deposition processes) of features the shapes of which correspond to the shapes laid down on the reticle. Each patterning step results in fabrication of a patterned layer of material that overlaps with some other layers fabricated at different steps of the integrated device fabrication process. As a result, integrated devices contain stacks of layers with overlapping geometrical patterns formed in various materials, and connected with the patterns in different layers of these integrated devices.

While the CD-control of lithographic patterns is an important aspect of the lithographic process used to ensure that the end product meets the design specification, related art overlooks the fact that performance of the integrated device components fabricated by lithographic exposure is determined not only by the shapes and CDs of the lithographic patterns, but also by mutual positioning of the edges of various image patterns—for example, by locations of the edges of a given image pattern in a given layer of the integrated device relative to (or with respect to) those of patterns in various other layers of the integrated device. Empirical evidence suggests that precise determination and monitoring of the locations of pattern edges proves to be critical for accurate and precise integrated device fabrication. Indeed, spatial misplacement of an image pattern (that, otherwise, has correct shape and dimensions) in a chosen layer of the integrated device relative to image patterns in integrated device layer(s) located above or below such chosen layer leads to degradation of operation of the integrated device or its malfunction. The yield of integrated device manufacture is determined not only by how well and/or precisely the individual layers of integrated devices are patterned, but also by how well patterns in various integrated device layers are aligned with respect to other patterns in other layers.

The time between the initial lithographic process development to manufacturing implementation of the developed process has shrunk dramatically in recent years. In general, it is rarely feasible to experimentally evaluate and optimize all aspects of a lithographic process prior to manufacturing introduction. It is well recognized that ability to predict and to monitor the pattern edges is critical to successful control of integrated device manufacture (see, for example, Progler, Bukofsky, and Wheeler, "Method to Budget and Optimize Total Device Overlay", SPIE Vol 3679, pages 193-207, 1999). What is more critical, however, is the process of configuring the optical projection system used for the formation of an image on the target substrate such as to minimize the pattern overlay errors alluded to above. While the related art addresses the image overlay procedure and describes pattern edge placement with the use of the results of measurement of overlay marks, the related art does not explain how to measure the spatial errors of the pattern edge placement on a target substrate with respect to the ideal location(s) of such placement. The related art is also silent with respect to a projection optics system that would allow the image overlay to be minimized or otherwise corrected (let alone how to tune the existing projection system, used to create the very images participating in the image overlay) in order to minimize or correct the image overlay. Furthermore, while emphasizing the device overlay budget, the related art does not address co-optimization of the pattern imaging and placement by adjusting entire imaging setup, including illumination and aberration contents of the projection optics. The solutions to such co-optimization and modification of the used-for-patterning projection optical systems are required.

SUMMARY

Embodiments of the invention provide a method for predicting and monitoring a position of an edge of an image of a reticle pattern formed on a wafer in a lithographic exposure process in an exposure tool. Such method includes the step of performing at least one wafer-exposure run in the exposure tool to determine, with the use of an optical detector of the exposure tool, first and second operational factors. Here, the first operational factors represent parameters of operation of said exposure tool and including descriptors of optical imaging in the exposure tool, and the second operational factors represent a shot-overlay characteristic of the exposure tool. The method further includes the step of determining, with a computer device, a change of a position of said edge on the wafer with respect to a target position based on the first operational factors and the second operational factors. In one embodiment, the exposure tool is then physically modified or, based on a value of the determined change of the position, by changing or adjusting one or more of presence, position, orientation, size, and shape of an optical component of the optical projection system to form a second image with the so-modified exposure tool (whether the second image is characterized by another, now reduced, difference between a position of an edge of the second image and the target position). Notably, in one specific case such modification of the exposure tool can be performed in absence of (that is, without) modifying a parameter of scanning synchronization of the exposure tool), while keeping the scanning synchronization the same. In a related implementation, the modifying may include changing hardware of the exposure tool to assemble an updated exposure tool forming, in operation, the second image the edge of which is placed closer to the target position than in the case with the use of previous, not-updated exposure tool.

The descriptors of optical imaging include (i) deviations of a surface of best focus of irradiance distribution of the image from a surface of the wafer and (ii) exposure dose as functions of position across a slit of the exposure tool. The method may further include a step of defining first relationships among image defocus, exposure dose, and critical dimensions of the image at the wafer. (In this case, optionally, the act of defining first relationships may include defining the first relationships at plural different locations of a scanner slit of the exposure tool and/or the method may additionally contain the steps of a) calculating the critical dimensions based on the first relationships, the image defocus, and the exposure dose; b) applying a blur correction based on at least one of defocus data and scan synchronization data generated by the exposure tool and c) comparing calculated critical dimensions with target critical dimensions corresponding to design specification. In general, the embodiment of the method may further include defining second relationships among image defocus, exposure dose, and a value of lateral shift of the image at the wafer (In this case, the act of defining the first relationships includes defining the first relationships at plural different locations of a scanner slit of the exposure tool. Further, in this case the method may additionally contain a step of calculating the value of lateral shift based on the second relationships, the image defocus, and the exposure dose.) In a related embodiment, the method additionally includes creating at least one of a defocus map and a dose map (and, in a specific implementation, the act of creating includes creating the dose map based on dose integrator data; and/or creating a defocus map based on data that includes at least one of (i) data acquired with the use of an interferometer of the exposure tool, (ii) total field deviation data, and (iii) focus correction data; and/or creating the defocus map based on a vector sum of topography target errors, stage trajectory errors, and image plane excursions. Any embodiment may additionally include a creating a map of image displacement values across the wafer, where such map represents values of image shift, which values have been determined as a function of locations across the wafer based at least on the first and the second operational factors. (In this case, the step of creating a map of image displacement includes applying a blur correction based on at least one of defocus data and scan synchronization data generated by the exposure tool.) In any embodiment, the step of determining is performed in-situ during an exposure step of a lithographic process with the exposure tool and/or the step of determining includes creating, in a computer process, a map of positions of edges of the image across the wafer.

Embodiments of the invention further provide a method for predicting and monitoring a position of an edge of an image of a reticle pattern formed on a wafer in a lithographic exposure process in an exposure tool. The method includes: a) calculating, with a computer processor, a change of position of the edge in comparison with a target position based on (i) empirically-determined first parameters representing non-uniformities of optical characteristics of the exposure tool across a scanner slit of the tool and (ii) empirically-determined second parameters representing non-uniformities of capability, of the exposure tool, to spatially align different exposure shots on the wafer with respect to one another.

Embodiments of the invention additionally provide a system configured to predict and monitor a position of an edge of a pattern image formed on a wafer. The system includes: a lithographic exposure tool and a computing device operably connected with the lithographic exposure tool. The lithographic exposure tool includes (i) a wafer-positioning apparatus configured to support the wafer, move the wafer with respect to a chosen reference position, and register movements of the wafer with the use of an optical interferometer; (ii) an illumination system containing a reticle, and an optical system configured to illuminate the reticle in a direction of the wafer; (iii) a projection optics configured to image the reticle on the wafer; and (iv) an optical detection unit configured to acquire a distribution of light irradiance, at a chosen plane within the exposure tool, as a function of location across at least one of the reticle and the wafer. The computing device is configured to (a) create an exposure dose map and an image defocus map based on data that represent optical irradiance distribution across the wafer and have been acquired, with the use of the optical detection unit, from at least one exposure run that creates the pattern image on the wafer; and (b) determine critical dimension and image shift values of the pattern image based on (i) the exposure dose map, (ii) the image defocus map, (iii) predetermined first relationships among image defocus and exposure dose and the critical dimensions, and (iv) predetermined second relationships among image defocus and expose dose and the image shift. In such a system, the exposure dose map is created based on data generated by a dose integrator of the exposure tool, and the image defocus map is created based on a vector sum of topography target errors, stage trajectory errors, and image plane excursions of the exposure tool.

Embodiments further provide a device configured to calculate an edge position of a pattern image formed on the substrate by an exposure apparatus. The device includes input electronic circuitry (configured to receive information representing a state of the exposure apparatus during operation thereof); and a controller in operable communication with the input electronic circuitry (and configured to determine the edge position based on the information). Here, the information includes data representing a scanning synchronization error of the exposure apparatus. In one implementation, the information includes first information that contains data representing a signal produced by an optical detector of the exposure apparatus during the operation of the exposure apparatus. (In this case, the first information may include data representing a dose of exposure of the substrate during the operation of the exposure apparatus and/or data representing a position of focus of radiation, to which the substrate is exposed during the operation of the exposure apparatus.) In one implementation of the device, the information includes second information that contains a control signal of the exposure apparatus during the operation of the exposure apparatus. Alternatively or in addition, the input electronic circuitry is further configured to receive third information representing a change in the edge position of the pattern image with respect to a change in the state of the exposure apparatus (here, the controller is further configured to calculate the edge position of the pattern image with the use of at least the information on the state of the exposure apparatus and the third information). When the input electronic circuitry is so configured, the controller is configured to determine, with the use of the third information, a correction to data representing the edge position calculated with the use of the information on the state of the exposure apparatus.

Embodiments additionally provide a method for calculation of an edge position of a pattern image formed on the substrate by an exposure apparatus. The method includes the steps of a) preparing information representing a state of the exposure apparatus during operation of the exposure apparatus; and b) determining the edge position of the pattern image with the use of the information on the state of the exposure apparatus. Here, the information on the state of the exposure apparatus includes data representing a scanning synchronization error of the exposure apparatus. In one implementation of the method, the step of preparing the information representing the state of the exposure apparatus includes acquiring, from the optical detector of the exposure apparatus, first information containing a signal produced by the optical detector during the operation of the exposure apparatus. Alternatively or in addition, such preparing may include: —acquiring the first information that includes data representing a dose of exposure of the substrate during the operation of the exposure apparatus; and/or—acquiring the first information that includes data representing a position of focus of radiation, to which the substrate is exposed during the operation of the exposure apparatus. In substantially any embodiment, the step of preparing the information representing the state of the exposure apparatus may also include processing, with a controller of the exposure apparatus, second information that contains a control signal of the exposure apparatus during the operation of the exposure apparatus; and/or preparing third information representing a change in the edge position of the pattern image with respect to a change in the state of the exposure apparatus (In this latter case, the determining includes calculating the edge position of the pattern image using at least the information on the state of the exposure apparatus and the third information. In a specific version of this latter case, the calculating includes correcting the edge position of the pattern image, that has been determined based on the information on the state, with the use of the third information.

An embodiment of the method for calculation of the edge position of the pattern image is further used in a method for exposing the substrate to radiation to form the pattern image thereon, which includes the steps of determining the edge position of the pattern image by using the method for calculation and can further contain steps of i) with a sensor of the exposure apparatus, determining whether the edge position falls within a predetermined range of positions, and ii) with a controller of the exposure apparatus, generating a warning signal when the edge position of the pattern image does deviates from said predetermined range of positions.

An embodiment of the method for exposing a substrate is further used in a device manufacturing method, that includes a) exposing the pattern image on the substrate using the method for exposing, b) developing the substrate after the exposing to form a mask layer having a contour corresponding to the pattern image; and c) processing a surface of the substrate through the mask layer.

BRIEF DESCRIPTION OF THE DRAWINGS

The invention will be more fully understood by referring to the following Detailed Description in conjunction with the generally not-to-scale Drawings, of which:

FIGS. 3A, 3B, 3C illustrate static and dynamic image exposure. FIG. 3A: top view of image field statically exposed in one shot in step-and-repeat projectors. FIG. 3B: side view of dynamic imaging taking place in scanning projectors. FIG. 3C: top view of dynamic exposure carried out with simultaneously scanning the reticle and the wafer in a direction perpendicular to the optical axis of the lens used to form an image of the reticle. Dynamic exposure of images takes place while simultaneously scanning the reticle in XY plane, in X direction. Crosses in FIGS. 3A, 3C indicate the locations of marks tracking the image overlay;

FIG. 4A shows uncorrected pattern displacements, while FIG. 4B shows the pattern displacements after systematic overlay components have been corrected. Such corrections are determined by first exposing a test wafer and analyzing and computing the systematic components of the pattern shifts on this test wafer, as FIG. 4A. These systematic shift components are then used to compute corrections for image placement, which corrections are applied during subsequent exposure of other wafers, thereby leading to corrected overlay shown in FIG. 4B. As the result, the subsequent wafers carry the corrected overlay distribution (the example of which is shown in FIG. 4B). {Note: the corrections determined based on Eqs. (2) through (4) can combine various contributions to edge displacements based on the choice of $\omega$, $\alpha$, and $\beta$. This choice is made by the user who conducts the edge-displacement optimization based on the user's understanding on how various, overlay- and imaging-driven, contributions to edge displacement impact the performance of the final integrated devices. For example, the user of the projector may conclude that the overlay-driven contributions are small in comparison with CD uniformity, and he/she might suppress $\omega$ and emphasize $\beta$. Under different circumstances, the user might conclude that CD uniformity does not make large contribution to the edge displacement, so he might suppress $\beta$, emphasize $\alpha$, and keep $\omega$ at a pre-determined level. Such strategy should be based the knowledge of imaging requirements and performance of any given pattern. It is understood, therefore, that the vectors 420 of FIG. 4B indicate the image-pattern shift that remains not corrected.

FIG. 5A illustrates the alignment of the shot centers within the coordinate system of the wafer. The contours 514B, 514C show the exposure field locations determined after applying the across-wafer and intra-field corrections, respectively. FIG. 5B illustrates the projection of the shots around the shot center. The squares show the pattern locations and the arrows show pattern shifts. The black squares 530A illustrate the design intent pattern location. The squares 530B and arrows 530C show shifts resulting from correction of intra-field overlay errors. The contour 520B, square 530D, and arrows 530E show the actual shifts caused by overlay random, uncorrectable components. The wafer, shot size, shot displacements, and shape excursions are shown not to scale.

FIG. 6A illustrates the layout of the pattern 610 representing a design-intent captured on the reticle pattern; the red cross 620 indicates the pattern target position. FIG. 5B illustrates the impact of various imaging conditions that degrade image contrast, causing thereby a change in image dimensions from 610 to 630. FIG. 6C illustrates, with a green arrow 640, a pattern displacement from 620 to the shifted-image center position 650 (marked with a green cross) caused by a combined impact of projector signature and projection aberrations. FIG. 6D illustrates the impact of resist on the image edges (for additional information, see PCT/US2015/048037). $EPE_{Top}$, $EPE_{Bottom}$, $EPE_{Left}$, and $EPE_{Right}$ are markings representing the locations of the resist pattern edges.

FIGS. 8A, 8B illustrate maps of the edge placement errors for left and right vertical edges. FIGS. 8C, 8D illustrate maps of the edge placement errors for lower and upper horizontal edges. Each of inserts in the maps of FIGS. 8A through 8D represents an enlarged view of the corresponding exposure field in the wafer.

FIGS. 9A, 9B, and 9C illustrate edge shifts of horizontal line patterns at 33 locations across the image field. The arrows show intra-field edge shifts such as the ones represented by the green arrow 640 in FIG. 6C. Here, the blue arrows 910 and the green arrows 914 show shifts of lower and upper horizontal edges respectively. FIG. 9A shows uncorrected edge shifts. FIG. 9B shows the edge distribution after corrections according to cost function of Eq. (2), optimizing the shape of the edge shift distribution. FIG. 9C shows the edge distribution after corrections according to cost function of Eq. (3), minimizing the largest edge shift in the image field. Corrections such as the ones that resulted in edge shift distribution shown in FIG. 9C, reduced the largest shift occurring in the center of the lower row, marked by the green array 914A in FIG. 9B. The shift scales in graphs of FIGS. 9A, 9B, and 9C are the same.

FIG. 10A shows the uncorrected shifts of contact hole patterns imaged with windmill quadrupole illuminator. FIG. 10B shows the edge shifts after the intra-field corrections were applied. The scales of the arrow shifts in FIGS. 10A, 10B are the same. FIG. 10C shows the same shifts as in FIG. 10B but with the scale magnified by 4X to show intra-field distribution of the shifts. FIG. 10D shows the edge shifts after different intra-field corrections were applied. The corrections that resulted in the edge shifts shown in FIG. 10D were obtained by tuning the illuminator from a windmill quadrupole layout shown in FIG. 11A to cross quadrupole layout, shown in FIG. 11B. The arrow scales in FIGS. 10C, 10D are the same, i.e. they are 4× of the arrow scales in FIGS. 10A, 10B.

Figure 1:
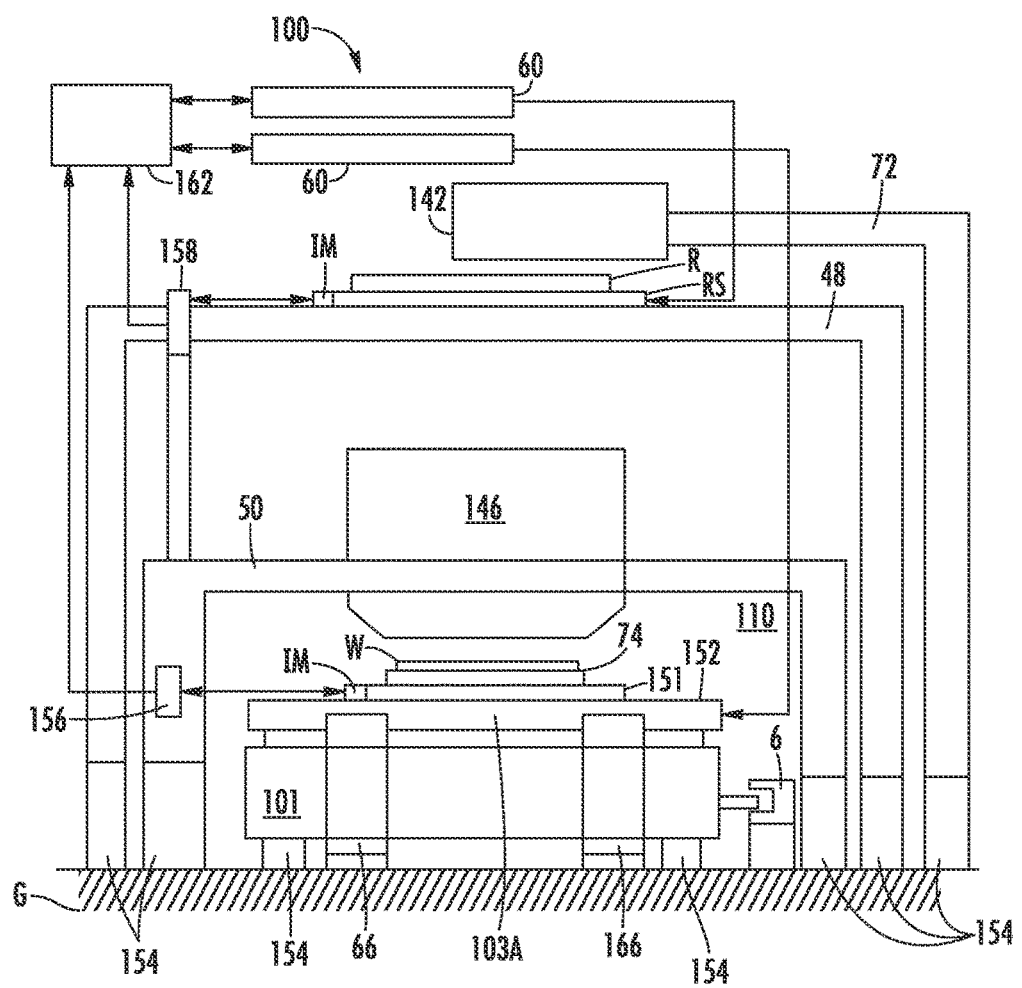
FIG. 1 is a diagram illustrating schematically an embodiment of a lithographic exposure tool.

Generally, the sizes and relative scales of elements in Drawings may be set to be different from actual ones to appropriately facilitate simplicity, clarity, and understanding of the Drawings. For the same reason, not all elements present in one Drawing may necessarily be shown in another.

DETAILED DESCRIPTION

Embodiments of the present invention provide a method and system for adjustment of a hardware of an optical-projection based imaging system (such as a lithographic exposure system configured to form images on a target substrate by projecting light thereon) based not only on the results of monitoring and recording of locations of overlay marks tracking the target locations of patterns, but also on the process of optimization of such results in light of (i) pattern-specific displacements of the patterns relative to target locations (represented by the overlay marks), and (ii) pattern-edge displacements caused by the variations of CDs that occur during patterning process. Subject to adjustment are optical and/or geometrical parameters of the imaging system. A skilled artisan will readily appreciate that, while the discussion of the embodiments of the invention uses the terms "wafer" or "substrate", such terms are used only for the purposes of consistency and simplicity and that, generally, both the processes and system(s) discussed herein are utilizing, in operation, workpiece(s). Workpiece is defined to be an object being worked on with the lithopographic exposure tool.

As a result, embodiments of the invention solve the problem of optimizing the feature edge placement and imaging at multiple locations in the image field of patterns projected in lithographic equipment by modifying the aberrations of (a) the illumination portion (or "illuminator") of the overall optical-projection based imaging system, (b) the projection portion or projection lens (which terms is used interchangeably with "projections optics") of the overall optical-projection based imaging system, and/or (c) a scanning system of the overall optical-projection based imaging system to co-optimize the placement of images and imaging performance based on a comprehensive edge-placement consideration. The term "projector" may be used herein interchangeably with the terms "optical-projection based imaging system" and "projection imaging system" to denote the overall system (such as a lithographic exposure tool). Examples of aberrations to be defined and modified include image field distortions and phase-front aberrations components at the exit pupil of the projection lens.

Specifically, embodiments of the invention are configured to optimize the pattern imaging process such as to minimize the degradation of images created by the projector. Such minimization of the degradation of the image, formed on the layer of a photoresist, is effectuated by adjusting the parameters and the setup of the projector to judiciously impact the placement of various image edges at different locations in the image field. Adjustments to the projector effectuated according to the idea of the present invention include a change of a setup parameter of the exposure tool (such as, for example, optical axis tilt, distribution of illumination in a principal plane of the exposure tool, polarization status in a principal plane of the projection system, illuminator flare, numerical aperture of the projection lens, projection lens aberrations, shape of the pupil of the projection lens, optical apodization, optical transmission and flare of the projection lens) and/or scanning synchronization errors and/or a change of a signature of the optical system of the exposure tool. The required adjustments are defined by minimizing the predetermined cost function(s) (also referred to interchangeably as merit function(s)) that are parts of a comprehensive edge-placement error (EPE) model. The term "flare" is to be understood as representing light scattered within a given optical component or a subsystem of the projector. The terms "polarization status" or "polarization" refer to any of the following descriptors: a degree of polarization, a polarization direction (vector), and non-polarized background, as well as to a combination of any of such descriptors. The errors in polarization (or polarization errors) define a deviation of the polarization status from the target polarization status.

As is well known in the art, the operation of the projection system unfolds in repeated steps. At each step, one image of the reticle is projected on the wafer (or, to be more specific, on a layer of photoresist carried by the wafer). Imaging of the reticle patterns can be done in a static manner, by exposing the entire image field all at once, or in a dynamic manner, by scanning a section of the reticle through an image slit of the projection system. For each reticle, this process is repeated multiple times to form multiple images of each patterned layer on the wafer. After one layer has been patterned and fabricated, another reticle may be used to pattern and fabricate another layer of an integrated device. The operation of the projection system aims at placing the images at various locations in the image plane (the plane at which the images of the reticle are formed). Such operation requires precise alignment of the image field (a two-dimensional space containing the images of the reticle) within the frame of reference established in the image plane. The alignment operation of the projector is hardly perfect. Therefore, the placement (locations) of the images is degraded by various detractors (caused by the imperfect performance of various subsystems of the projector), which include, for example, the quality of alignment of the image plane placement sensors, the interpretation of signals such sensors produce, the imperfect operation of the image plane placement controllers, and fluctuations and drifts in the imaging environment. The placement inaccuracies resulting from imperfect overlay operation lead to displacements of the image fields relative to the frame of reference in the image plane.

In addition, a projection system used to form the images is not perfect in a sense that it does not produce identical images perfectly matching specifications at every location of the image field. Pattern images projected at the image plane are subject to various distortions of shape and displacements with respect to their target locations (that are specified by the pattern design). The origins of these displacements can include the mechanical operation of the projection system (for example, the image field distortions occurring during the scanning operation of a scanner). The distortions and displacements can also be caused by the optical characteristics of the projection system (for example, aberrations of the illuminator and/or projection optics) caused by imperfect design and manufacturing tolerances of the optic involved, and in particular, by illuminator imperfections, image field distortions, image field curvature, and residual aberrations represented by phase front variation of the projection lens pupil, to name just a few.

As the result, during the operation of the projector, the placement of the images of various patterns at the target locations in the image plane is affected by at least two features: 1) a patterning overlay or image overlay performance, which impacts the ability of the projector to align the images relative to their target positions, and 2) image displacements caused by the optical characteristics of the projection system.

A complete description of the image displacements, caused by the overlay and the imaging operation of the projectors, requires a completion of the task not yet addressed by related art—that the image edge placement errors be quantified. The capture of edge-placement errors impacts the projector overlay and the imaging performance at various locations across the image plane.

Non-Limiting Example of a Photolithographic (Exposure) Apparatus and Related Systems.

FIG. 1 is a schematic view illustrating but one implementation of a photolithography apparatus 100 (e.g., scanner, imaging system, exposure apparatus, etc.) in accordance with the present invention. The wafer positioning unit 152 includes a wafer stage 151, the following stage 103A and an actuator 106. The wafer stage 151 comprises a wafer chuck that holds a wafer W and an interferometer minor IM. The exposure apparatus 100 can also include an encoder to measure stage position (not shown for simplicity of illustration). The base 101 may be supported by a plurality of isolators 154 (sometimes referred to a reaction frame), a least one of which may include a gimbal air bearing. The following stage base 103A is supported by a wafer stage frame (reaction frame) 166. The additional actuator 106 is supported on the ground G through a reaction frame. The wafer positioning stage 152 is configured to move the wafer stage 151 with multiple (e.g., three to six) degrees of freedom under the precision control provided by an optionally-programmable drive control unit and/or system controller 162, and to position and orient the wafer W as desired relative to the projection optics 146. Generally, controller is understood to be a (optionally programmable) device or regulating system or mechanism that governs the transfer of data from a computer to a peripheral device and vice versa. In the specific embodiment 100, the wafer stage 151 has six degrees of freedom and utilizes forces vectored in the Z direction and generated by the x-motor and the y-motor of the wafer positioning stage 152 to control a leveling of the wafer W. However, a wafer table having three degrees of freedom (such as for example Z, $\theta_x$, $\theta_y$) or six degrees of freedom can be attached to the wafer stage 151 to control the leveling of the wafer. The wafer table may include the wafer chuck, at least three voice coil motors (not shown), and a bearing system. The wafer table may be levitated in the vertical plane by the voice coil motors and supported on the wafer stage 151 by the bearing system so that the wafer table can move relative to the wafer stage 151.

The reaction force generated by the wafer stage 151 motion in the X direction can be canceled by motion of the base 101 and the additional actuator 106. Further, the reaction force generated by the wafer stage motion in the Y direction can be canceled by the motion of the following stage base 103A.

An illumination lens or illuminator 142 is supported by a frame 172. The illumination lens 142 projects radiant energy (e.g., light) through a mask pattern on a reticle R that is supported by and scanned using a reticle stage RS. (Alternatively, in the case of when the system 100 utilizes extreme ultraviolet (EUV) radiation, the reticle R may be configured to operate in reflection). The reticle stage RS may have a reticle coarse stage for coarse motion and a reticle fine stage for fine motion. In this case, the reticle coarse stage corresponds to the translation stage table 110, with one degree of freedom. The reaction force generated by the motion of the reticle stage RS can be mechanically released to the ground through a reticle stage frame and the isolator 154 (in one example—in accordance with the structures described in JP Hei 8-330224 and U.S. Pat. No. 5,874,820, the entire contents of each of which are incorporated by reference herein). The light is focused by a projection optics (in one embodiment—a lens assembly) 146 supported on a projection optics frame 150 and released to the ground through isolator 154. The assembly 146 may include radiation-transmitting glass elements (refractive elements), reflectors (such as minors) or a combination of the two (thereby forming a catadioptric projection optics).

An interferometer 156 is supported on the projection optics frame 150 and configured to detect the position of the wafer stage 151 and output the information of the position of the wafer stage 151 to the system controller 162. A second interferometer 158 is supported on the projection optics frame 150 and configured to detect the position of the reticle stage and to produce an output containing the information of the position to the system controller. The system controller controls a drive control unit to position the reticle R at a desired position and orientation relative to the wafer W and/or the projection optics 146.

There are numerous different types of photolithographic devices which can benefit from employing an embodiment of the present invention. For example, the apparatus 100 may comprise an exposure apparatus that can be used as a scanning type photolithography system, which exposes the pattern from reticle R onto wafer W with reticle R and wafer W moving synchronously. In a scanning type lithographic device, reticle R is moved perpendicular to an optical axis of projection optics 146 by reticle stage and wafer W is moved perpendicular to an optical axis of projection optics 146 by wafer positioning stage 152. Scanning of reticle R and wafer W occurs while reticle R and wafer W are moving synchronously but in opposite directions along mutually parallel axes parallel to the x-axis.

Alternatively, the exposure apparatus 100 can be a step-and-repeat type photolithography system that exposes reticle R, while reticle R and wafer W are stationary. In the step and repeat process, wafer W is in a fixed position relative to reticle R and projection optics 146 during the exposure of an individual field. Subsequently, between consecutive exposure steps, wafer W is consecutively moved by wafer positioning stage 152 perpendicular to the optical axis of projection optics 146 so that the next field of semiconductor wafer W is brought into position relative to projection optics 146 and reticle R for exposure. Following this process, the images on reticle R are sequentially exposed onto the fields of wafer W so that the next field of semiconductor wafer W is brought into position relative to projection optics 146 and reticle R.

The use of the exposure apparatus 100 schematically presented in FIG. 1 is generally not limited to a photolithography system for semiconductor manufacturing. The apparatus 100 (an exposure apparatus or tool), can be used for example as an LCD photolithography system that exposes a liquid crystal display device pattern onto a rectangular glass plate or a photolithography system for manufacturing a thin film magnetic head.

In the illumination system 142, the illumination source can be a source configured to generate light at g-line (436 nm), i-line (365 nm), or to include a KrF excimer laser (248 nm), ArF excimer laser (193 nm), F2 laser (157 nm) or to generate radiation in EUV (for example, at about 13.5 nm).

With respect to projection optics 146, when far ultra-violet rays such as the excimer laser is used, glass materials such as quartz and fluorite that transmit far ultra-violet rays are preferably used. When the F2 type laser, projection optics 146 should preferably be either catadioptric or refractive (a reticle should also preferably be a reflective type). When extreme ultra-violet (EUV) rays or x-rays are used the projection optics 46 should preferably be fully reflective, as should the reticle.

With an exposure device that employs vacuum ultra-violet radiation (VUV) of wavelength 200 nm or shorter, use of the catadioptric type optical system can be considered. Examples of the catadioptric type of optical system include the disclosure Japan Patent Application Disclosure No. 8-171054 published in the Official Gazette for Laid-Open Patent Applications and its counterpart U.S. Pat. No. 5,668,672, as well as Japanese Patent Application Disclosure No. 10-20195 and its counterpart U.S. Pat. No. 5,835,275. In these cases, the reflecting optical device can be a catadioptric optical system incorporating a beam splitter and concave mirror. Japanese Patent Application Disclosure No. 8-334695 published in the Official Gazette for Laid-Open Patent Applications and its counterpart U.S. Pat. No. 5,689,377 as well as Japanese Patent Application Disclosure No. 10-3039 and its counterpart U.S. Pat. No. 5,892,117 also use a reflecting-refracting type of optical system incorporating a concave minor, etc., but without a beam splitter, and can also be employed with this invention. The disclosure of each of the above-mentioned U.S. patents, as well as the Japanese patent applications published in the Office Gazette for Laid-Open Patent Applications is incorporated herein by reference.

Further, in photolithography systems, when linear motors that differ from the motors shown in the above embodiments (see U.S. Pat. Nos. 5,623,853 or 5,528,118) are used in one of a wafer stage or a reticle stage, the linear motors can be either an air levitation type employing air bearings or a magnetic levitation type using Lorentz force or reactance force. Additionally, the stage could move along a guide, or it could be a guideless type stage that uses no guide. The disclosure of each of U.S. Pat. Nos. 5,623,853 and 5,528,118 is incorporated herein by reference.

Alternatively, one of the stages could be driven by a planar motor, which drives the stage by electromagnetic force generated by a magnet unit having two-dimensionally arranged magnets and an armature coil unit having two-dimensionally arranged coils in facing positions. With this type of driving system, either one of the magnet unit and the armature coil unit is connected to the stage, and the other unit is mounted on the moving plane side of the stage.

Movement of the stages as described above generates reaction forces that can affect performance of the photolithography system. Reaction forces generated by the wafer (substrate) stage motion can be mechanically released to the floor (ground) by use of a frame member as described in U.S. Pat. No. 5,528,118 and published Japanese Patent Application Disclosure No. 8-166475. Additionally, reaction forces generated by the reticle (mask) stage motion can be mechanically released to the floor (ground) by use of a frame member as described in U.S. Pat. No. 5,874,820 and published Japanese Patent Application Disclosure No. 8-330224. The disclosure of each of U.S. Pat. Nos. 5,528, 118 and 5,874,820 and Japanese Patent Application Disclosure No. 8-330224 is incorporated herein by reference.

Figure 2:
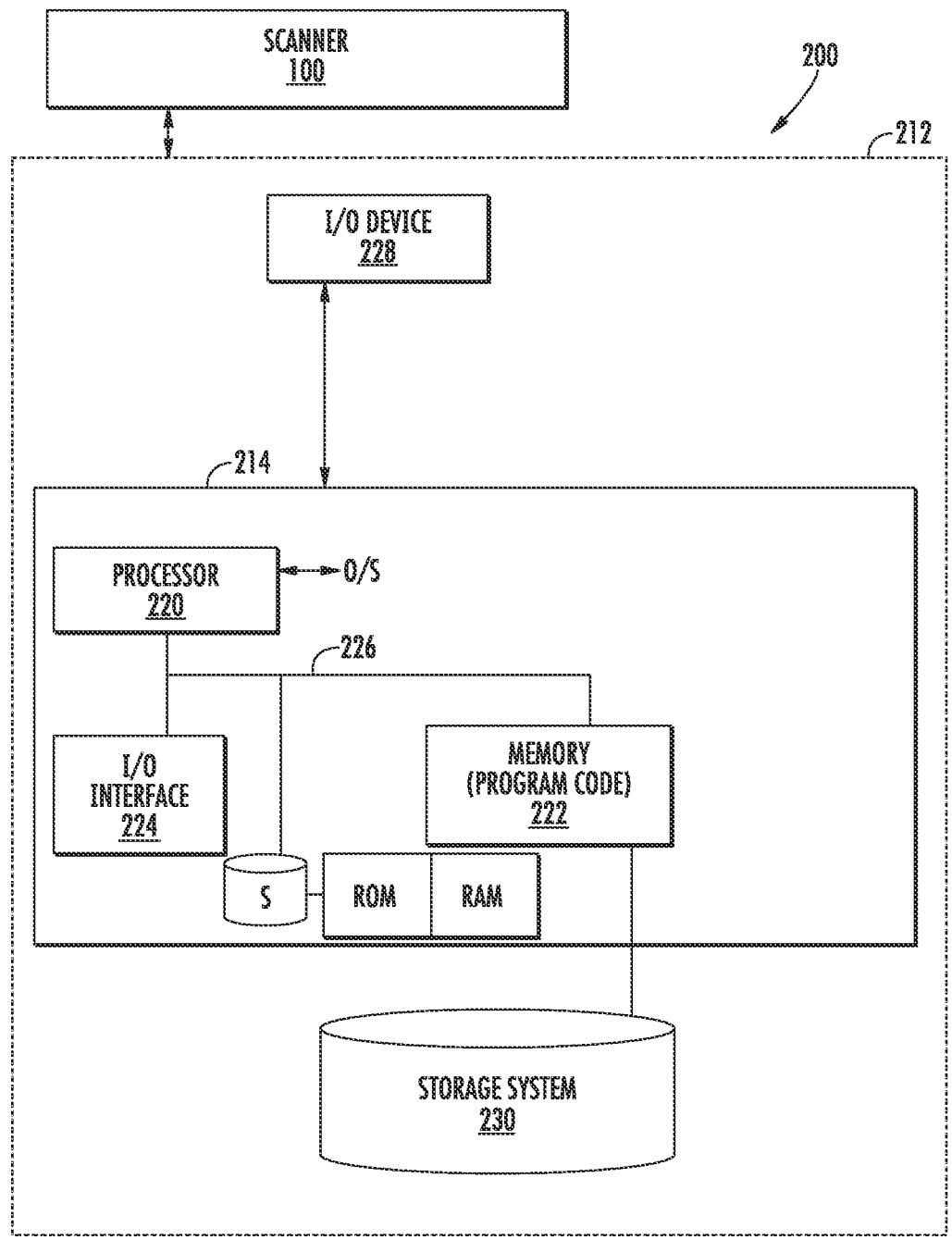
FIG. 2 schematically illustrates an example of operational environment configured to implement an embodiment of a method of the invention.

FIG. 2 provides a schematic illustration of environment 210 configured to manage the processes effectuated by the system 100. The environment 210 includes a server 212 that can perform the processes described herein using appropriately structured computer program code(s). As should be appreciated by those of skill in the art, the server 212 includes a computing device 214 having one or more processors 220, memory 222, an input-output (I/O) interface 224, and a bus 226. The memory 222 can include local memory employed during actual execution of program code(s), as one non-limiting example. The server 212 and/or computing device 214 are configured to read and/or receive information from the scanner 100, and use this information to predict critical dimensions of the images pattern and placement of its edges across the wafer that is being processed in the scanner 100. As used herein, the terms scanner and scanner apparatus refer to a photolithography apparatus (e.g., imaging system, exposure apparatus, etc.) used in lithography.

The one or more processors 220 may be dedicated processors programmed for execution of particular processes or combination of processes in accordance with the invention, which may be performed on the server 212 and/or the computing device 214. The server 212 and/or computing device 214 may also be dedicated to particular processes or combination of processes in accordance with the invention. Accordingly, the computing device 214 and/or server 212 can include any combination of general and/or specific purpose hardware (e.g., one or more electronic circuits such as dedicated processors 220) and/or computer program code(s). The server 212 and/or computing device 214 are configured to communicate over any type of communications link, such as, for example: wired and/or wireless links; any combination of one or more types of networks (e.g., the Internet, a wide area network, a local area network, a virtual private network, etc.); and/or utilize any combination of transmission techniques and protocols.

The computing device also includes an I/O device 228 that may be external to either the computing device 214 or the server 212. The I/O device 228 can be, for example, a device that is configured to enable an individual (user) to interact with the computing device 214, such as a display equipped with GUI. In embodiments, the user can enter information into the system by way of the GUI (I/O device 228). In one example, the input items can be accessible to the user by a dialog box. In addition, it is contemplated that the I/O device 228 is configured to lead the user through the input requirements by providing input boxes for textual input or pointer action.

By way of illustration, the I/O device 228 is configured to accept data associated with the imaging apparatus 100 and reticle/mask R of FIG. 1, amongst other information. Such data can include, for example, user-defined laser wavelength, laser bandwidth, laser spectrum, immersion and dry exposure data, a default index of refraction (for water), pupil intensity, immersion exposure, threshold information (e.g., low intensity information from pupilgram files), polarization information, etc. The mask information may include, for example, editing capabilities for amplitude and phase information, etc., as well as accepting GDS or OASIS mask files]. The server 212 (and/or computing device 214) includes a centralized device repository, e.g., tangible, non-transitory storage memory system 230. In embodiments, the centralized device repository 230 is configured and/or designed to store the computer code and library information (data).

According to the idea of the invention, the locations of the pattern edges are assessed at various points or positions across the wafer and within the exposure field while images of the reticle are being formed (projected by the imaging apparatus, be it a scanner or a static stepper), by acquiring data representing
  i. repeatability and/or accuracy of placement of image(s) onto the resist layer (which is independent from defocus and dose of exposure traces), affecting, for example, aspects of wafer alignment accuracy and repeatability, determined by the wafer and wafer stage operational conditions, both on the scale of the whole wafer and on the scale of a given image field (also referred to as shot); and/or
  ii. optical imaging conditions and parameters (such as descriptors of the illumination and projection setup, determining pattern-specific image displacements; and/or
  iii. imaging tool performance such as defocus and dose of exposure captured by the traces that are generated by the scanner, that affect the quality and accuracy and precision of optical image formation on the wafer resist layer; and
modifying at least one of mechanical and optical characteristic of the projection system based on these data to form a transformed projection system to minimize the image edge placement errors.

In a specific embodiment, when the imaging apparatus includes a scanner, the locations of the image edges are assessed in situ, contemporaneously with the wafer being processed in the scanner.

Image Placement Driver(s) or Causes of Image-Edge Displacements.

During the exposure process, the purpose of the operation of the projector alignment system is to ensure that various exposure fields are delivered to (placed at) the target locations of corresponding image fields ("shots").

Schematics of FIGS. 3A, 3B, 3C provide illustrations to static and dynamic image exposure. FIG. 3A provides a top view of an image field statically exposed in one shot in step-and-repeat projectors. FIG. 3B illustrates a side view of dynamic imaging taking place in scanning projectors. FIG. 3C presents a top view of a dynamic exposure carried out by simultaneously scanning the reticle and the wafer in a direction perpendicular to the optical axis of the projection lens used to form an image of the reticle. Dynamic exposure of images takes place while simultaneously scanning the reticle in XY plane, in X direction. Crosses in FIGS. 3A, 3C indicate the locations of marks tracking the image overlay.

The capability of the projector to place the shots on targets is referred to as "overlay". The overlay performance of the projector is limited by the ability of the system to accurately align the shots with the target locations. Some of the deviations between the actual placements of shots and the target locations are repeatable and can be quantified and corrected, while other small, residual overlay displacements remain uncorrected (and can be random or systematic). The overlay performance of the projection system is tested prior to or during the wafer exposure to correct the repeatable deviations such that after the appropriate corrections are introduced, the overlay substantially consists of small, uncorrected displacements caused by residual errors in overlay performance of the projector. The initial, uncorrected results of image-pattern shifts caused by overlay performance and those corrected as a result of application of the embodiment of the invention are discussed below in reference to FIGS. 4A, 4B.

Imaging Driver(s) or Optical-Imaging Causes of Image-Edge Displacements

It is appreciated that imaging conditions may differ at various locations in the exposure field. These differences may be due to variations in imaging conditions such as mask pattern CD variation(s), reticle bending, illumination layout and polarization variations, the numerical aperture (NA) of the projection lens, aberration and apodization variations, image field curvature, scanner flare, and localized resist responses that are induced by the resist process.

The detailed discussion of the errors in edge placement of the final image of the reticle caused by issues related to the variations of the CD of the mask (reticle) pattern was presented, for example, in PCT/US2015/048037. In comparison, this disclosure addresses imaging causes associated with variation of imaging conditions that are unrelated to the mask pattern. The distortion of the image field, the image field curvature, illuminator and projection lens aberrations, various displacements and/or changes in alignment of components of the optical projection system with respect to the design provide examples of such factors that cause variations of image placement and dimensions at various locations across the image field and that are not related to the mask pattern. These image-dimension variations and image displacements, induced by the process of image formation in the projector and combined with the image displacement caused by the degradation in overlay performance, result in displacements of pattern edges at various locations in the image field.

Figure 5A:
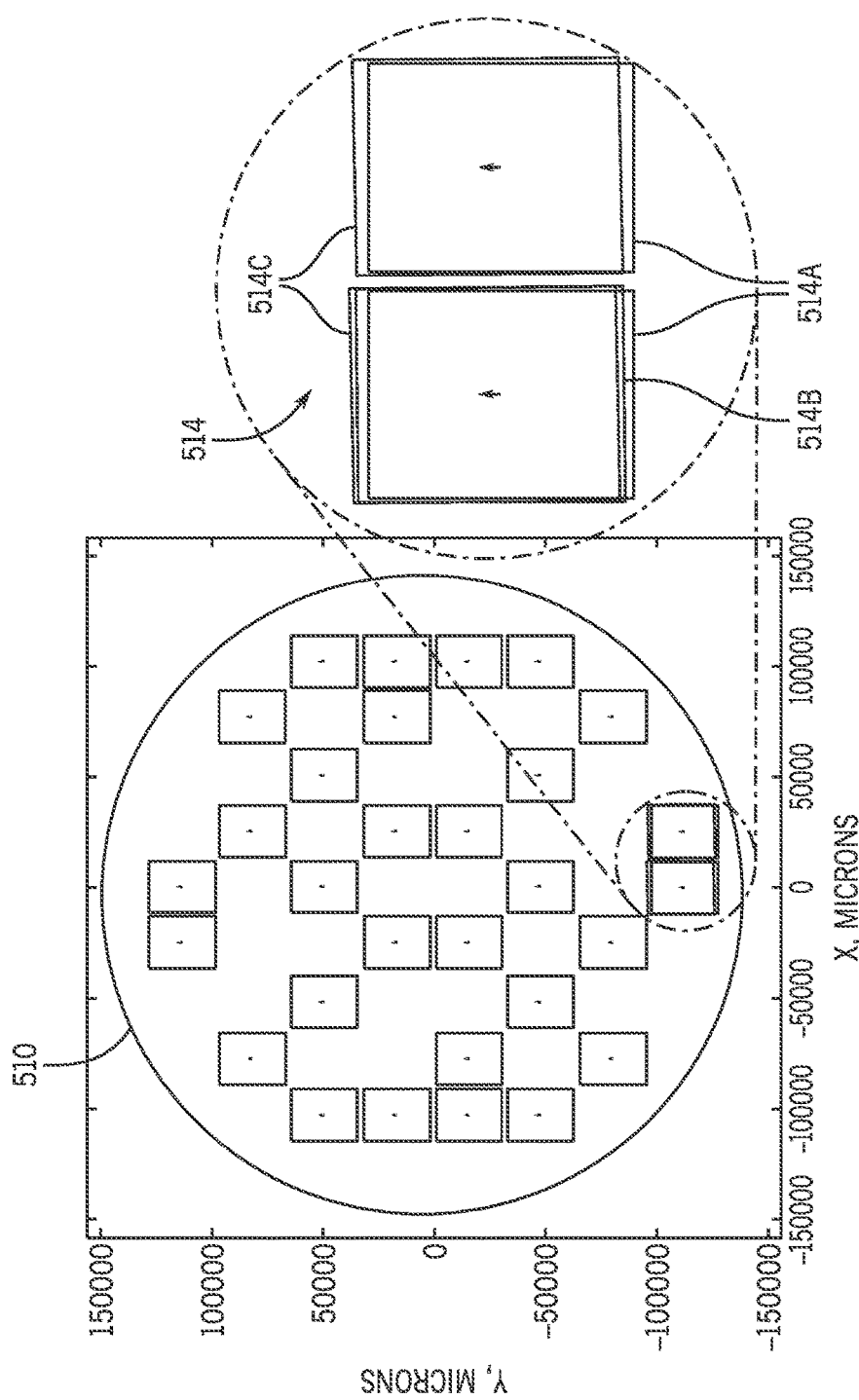
FIGS. 5A, 5B illustrate an exposure (image) field, marked within the wafer 510 with the image field rectangular contours 514, and, for a given field 520, identify thirty-five locations 530 across the field (placed in seven rows at five different locations) where overlay marks, such as those indicated by crosses 310 in FIG. 3A would be located. Black lines 514A represent design intent under perfect alignment of each pattern exposure field, referred to as "shot".
Figure 5B:
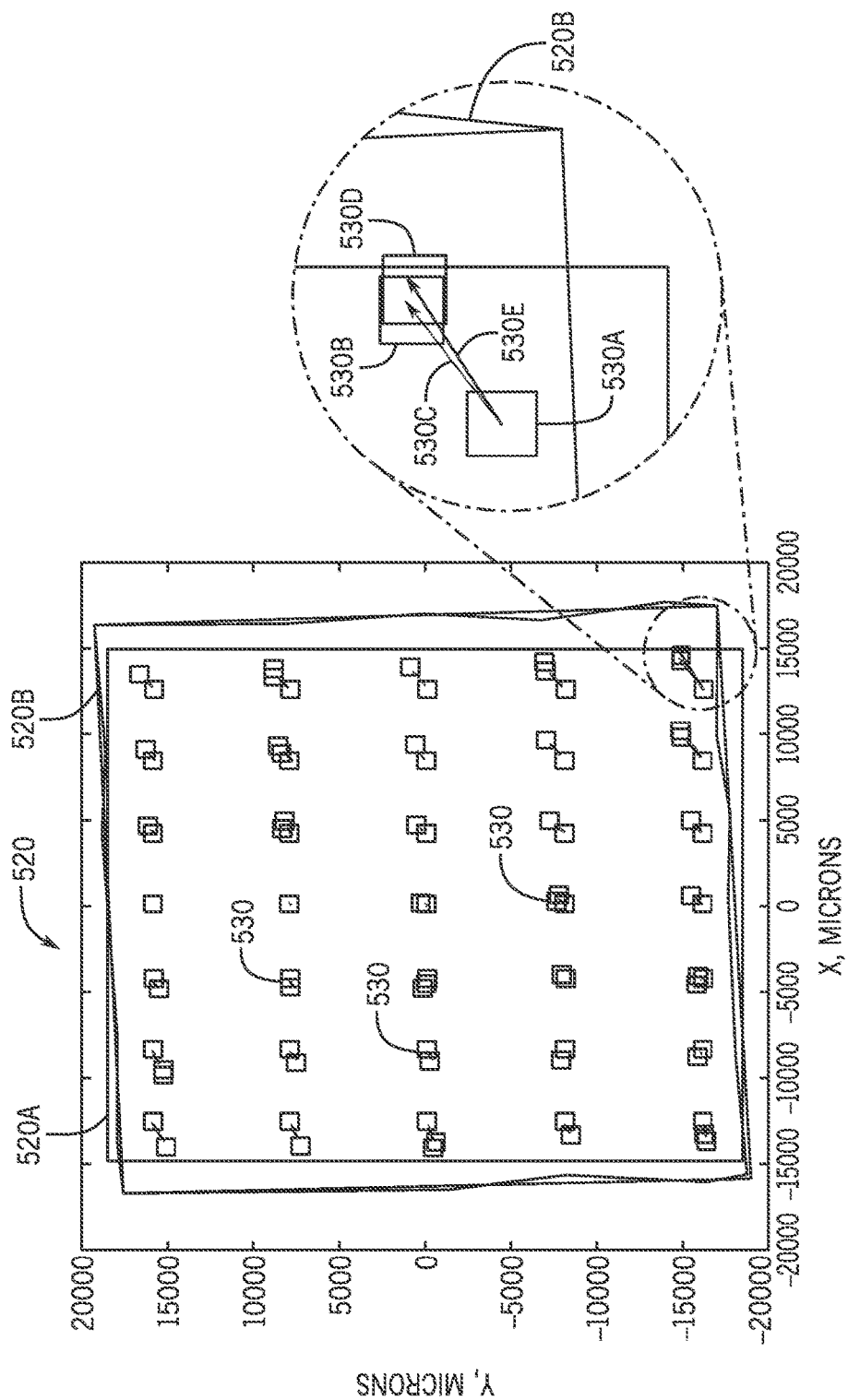

To this end, FIGS. 5A, 5B illustrate an exposure (image) field, marked within the wafer 510 with the image field rectangular contours 514, and, for a given field 520, identify thirty-five locations 530 across the field (placed in seven rows at five different locations) where overlay marks, such as those indicated by crosses 310 in FIG. 3A would be located. Black lines 514A represent design intent under perfect alignment of each pattern exposure field, referred to as "shot". FIG. 5A illustrates the alignment of the shot centers within the coordinate system of the wafer. The blue and magenta contours 514B, 514C show the exposure field locations determined after applying the across-wafer and intra-field corrections, respectively. FIG. 5B illustrates the projection of the shots around the shot center. The squares show the pattern locations and the arrows show pattern shifts. The black squares 530A illustrate the design intent pattern location. The magenta squares 530B and arrows 530C show shifts resulting from correction of intra-field overlay errors. The red contour 520B, square 530D, and arrows 530E show the actual shifts caused by overlay random, uncorrectable components. The wafer, shot size, shot displacements, and shape excursions are shown not to scale.

Figure 6A:
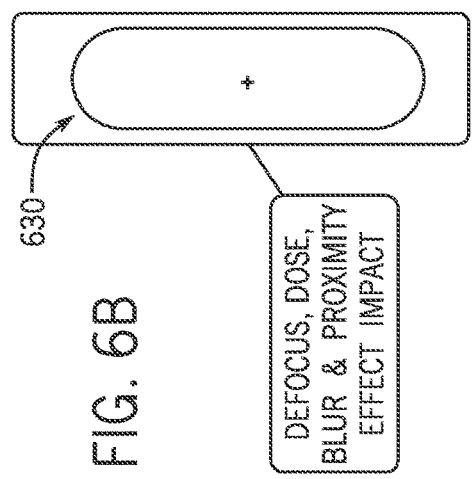
FIGS. 6A, 6B, 6C, and 6D illustrate imaging drivers of pattern edge displacements.
Figure 6B:
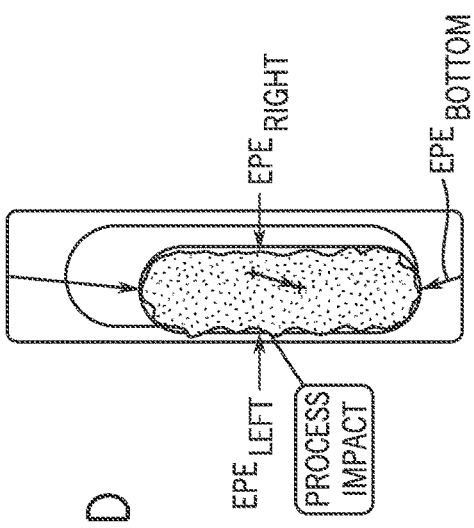
Figure 6C:
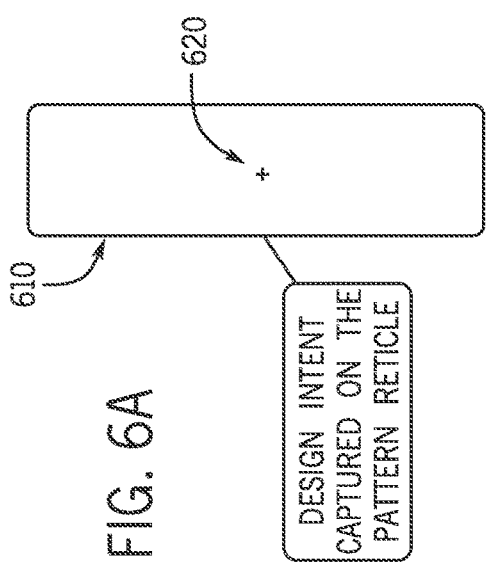
Figure 6D:
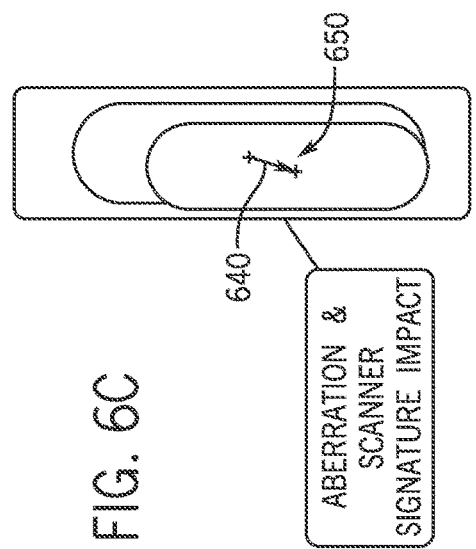

FIGS. 6A, 6B, 6C, and 6D provide illustration to optical-imaging drivers of pattern edge displacements. FIG. 6A shows the layout of the pattern 610 representing a design-intent captured on the reticle pattern; the red cross 620 indicates the pattern target position. FIG. 5B illustrates the impact of various imaging conditions that degrade image contrast, causing thereby a change in image dimensions from 610 to 630. FIG. 6C illustrates, with a green arrow 640, a pattern displacement from 620 to the shifted-image center position 650 (marked with a green cross) caused by a combined impact of projector signature and projection aberrations. FIG. 6D illustrates the impact of resist on the image edges (for additional information, see PCT/US2015/048037). $EPE_{Top}$, $EPE_{Bottom}$, $EPE_{Left}$, and $EPE_{Right}$ are markings representing the locations of the resist pattern edges.

Figure 7:
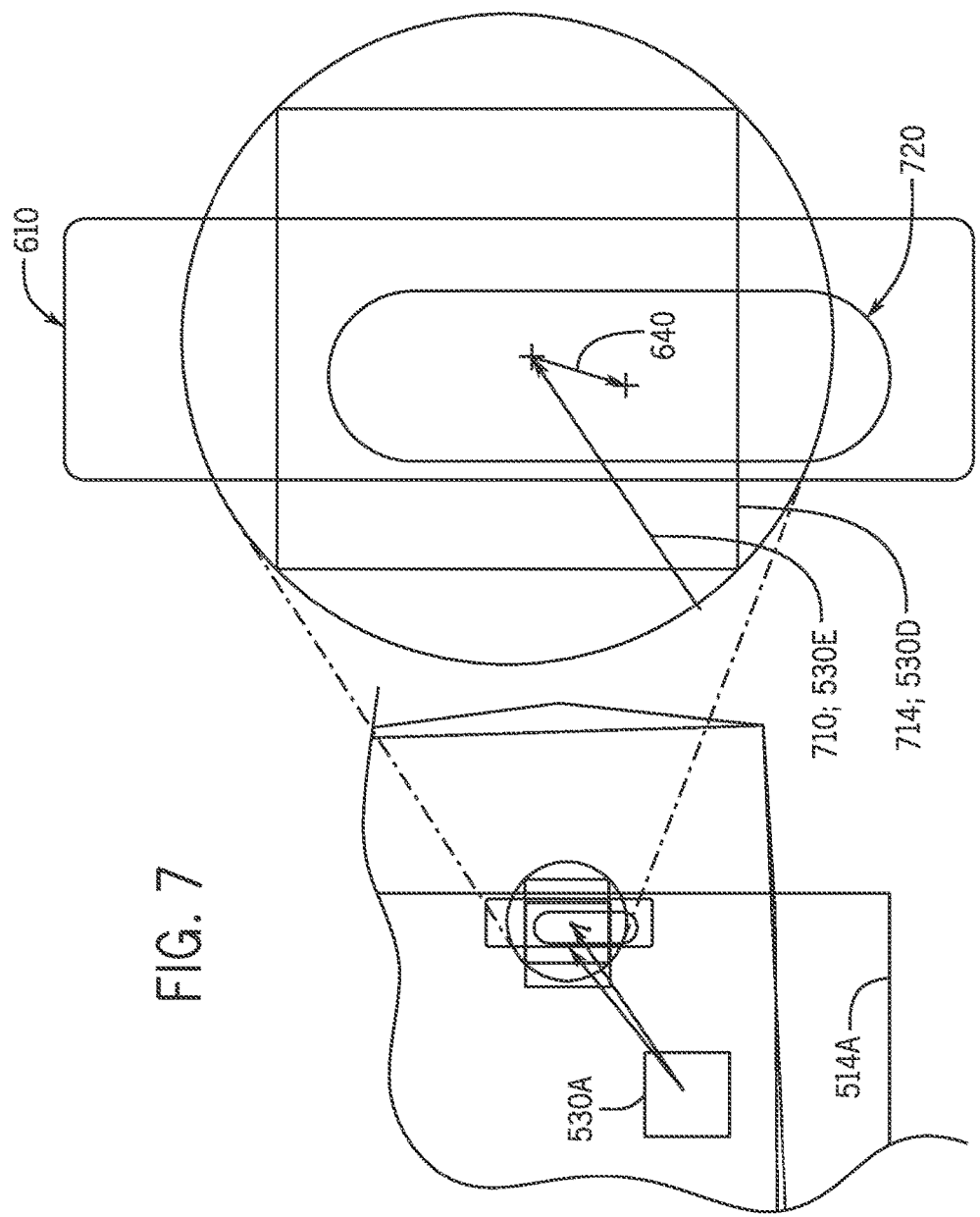
FIG. 7 presents a schematic diagram illustrating a pattern edge displacement caused by a projector. The red arrow 710 and square 714 show the actual placement of the pattern after overlay systematic errors have been corrected. These red arrow and square are the same as corresponding element 530D, 530E in FIG. 5. The green arrow 640 shows shift caused by optical operation of the projector, i.e. shift caused by a combined impact of projector signature and projection aberrations shifting the pattern image relative to the actual pattern placement target location. The shift marked by the green arrow 640 is the same as in graphs of FIGS. 6C and 6D. The shape and dimension change of the pattern imaged by the projector, shown as light oval 720, relative to design intent marked as 610, illustrates a contribution to edge displacements caused by the pattern CD variations.

FIG. 7 and insert present a schematic diagram illustrating a pattern edge displacement caused by a projector. The red arrow 710 and square 714 show the actual placement of the pattern after overlay systematic errors have been corrected. These red arrow and square are the same as corresponding element 530D, 530E in FIG. 5. The green arrow 640 shows shift caused by optical operation of the projector, i.e. shift caused by a combined impact of projector signature and projection aberrations shifting the pattern image relative to the actual pattern placement target location. The shift marked by the green arrow 640 is the same as in graphs of FIGS. 6C and 6D. The shape and dimension change of the pattern imaged by the projector, shown as light oval 720, relative to design intent marked as 610, illustrates a contribution to edge displacements caused by the pattern CD variations.

Figure 8A:
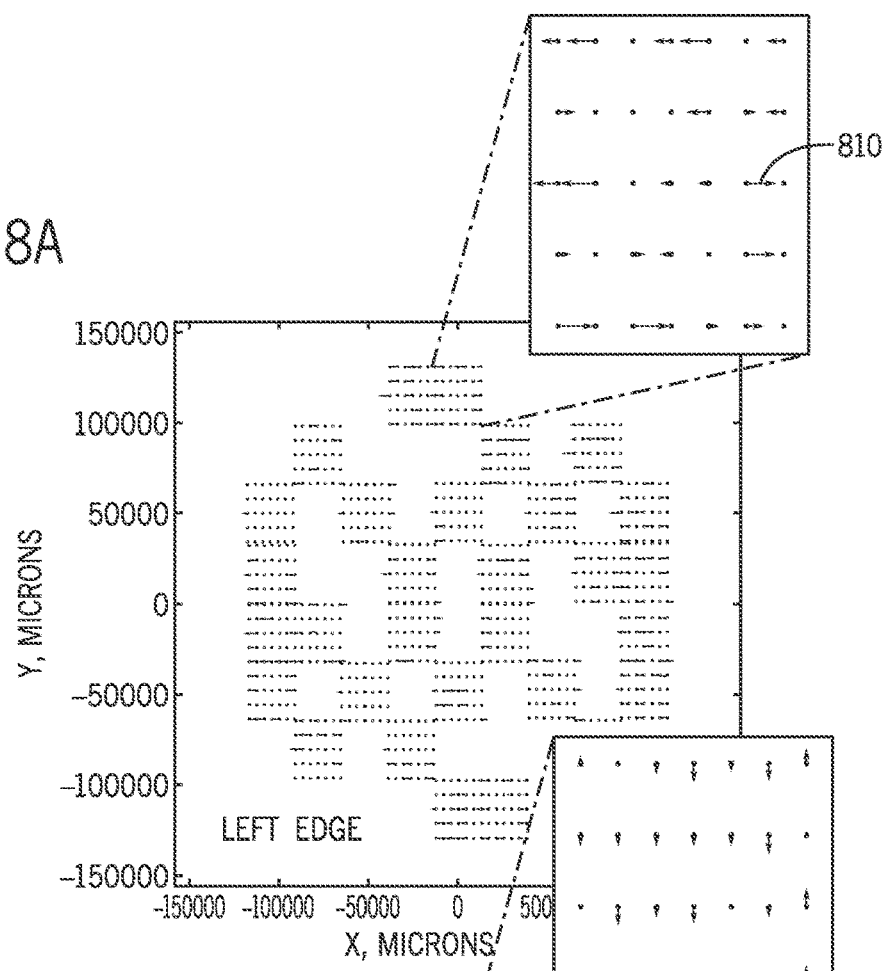
FIGS. 8A, 8B, 8C, 8D: Vector graphs illustrating errors in pattern-edge placement (the shifts of pattern edges). Each vector/arrow 810 in the map shows the direction and magnitude of the edge shift at one of the locations on the wafer.
Figure 8C:
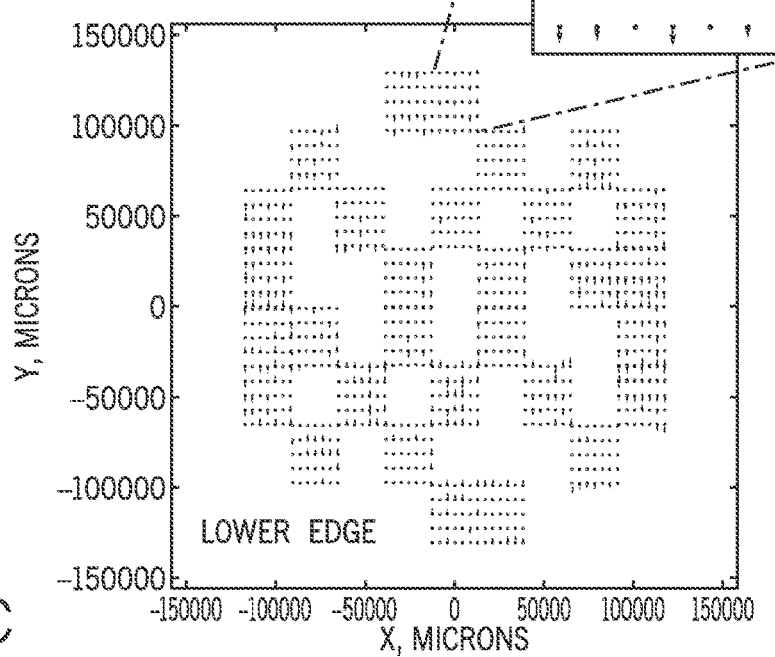
Figure 8B:
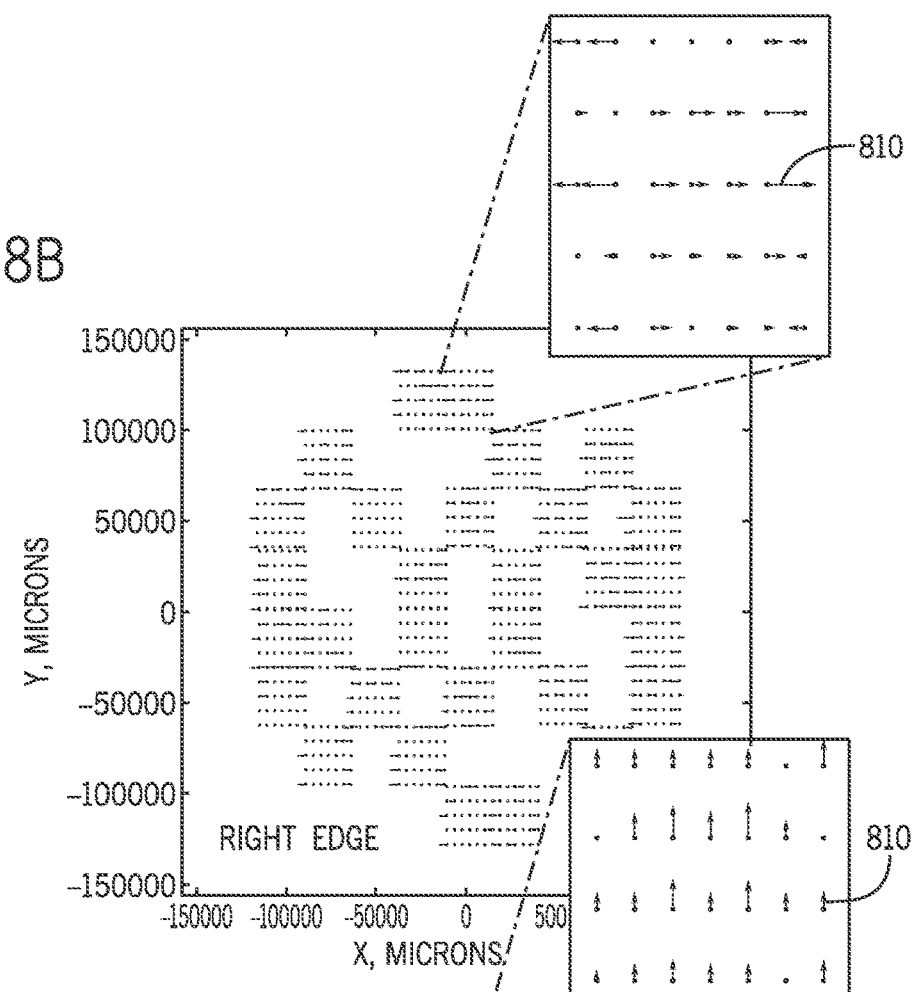
Figure 8D:
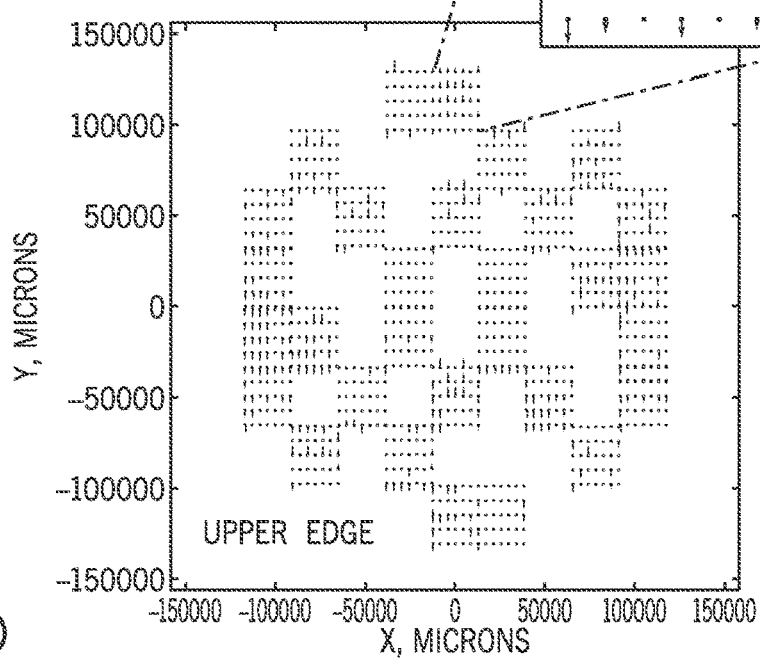

FIGS. 8A, 8B, 8C, 8D provide vector graphs illustrating errors in pattern-edge placement (the shifts of pattern edges). Each vector/arrow 810 in the map shows the direction and magnitude of the edge shift at one of the locations on the wafer. FIGS. 8A, 8B illustrate maps of the edge placement errors for left and right vertical edges. FIGS. 8C, 8D illustrate maps of the edge placement errors for lower and upper horizontal edges. Each of inserts in the maps of FIGS.

8A through 8D represents an enlarged view of the corresponding exposure field in the wafer.

Representation of Edge-Placement Errors.

All of the above causes in the image dimensions and image placements lead to image edge placement errors, EPEs. Indexing multiple locations in each image field by l and multiple edge of a given image by i, the overall edge placement error EPE i,l for the placement of the i-th edge of a given image at the l-th location is quantified by the sum:

$$EPE_{i,l} = EPE_{i,l}^{OVL} + EPE_{i,l}^{POS} + EPE_{i,l}^{IMG} \quad (1)$$

Where $EPE_{i,l}^{OVL}$ is the contribution to i-th image edge placement error due to image displacement caused by the projection overlay at the l-th location. This contribution to the edge placement error is caused by system errors other than those occurring in the optical sub-systems of the projection system, except for distortion errors. It is typically determined from an overlay error measurement. This contributions to edge displacements are independent of the image dimensions.

$EPE_{i,l}^{IMG}$ is the contribution to the i-th image edge placement error due to image size (CD) variations at the l-th location. In the related art, the CD variation is measured, as discussed in detail in Ser. 62/112,423 but is not accounted towards the EPE. These contributions to edge displacements are dependent on the pattern dimensions.

Finally, $EPE_{i,l}^{POS}$ is the contribution to the i-th image edge placement error due to image displacement caused by imaging at the l-th location. According to the idea of this invention, the value of this contribution to the image-edge placement error is assessed from the sensitivity of the pattern placement to the imaging system setup and imaging conditions.

In practice, determination or assessment of the value of such contribution is effectuated either by a computation of the imaging performance of the system or via imaging tests.

Cost Functions as a Measure of Edge Displacements.

Cost functions, representing edge placement errors of various pattern images at various image locations, can be expressed as:

$$c_{dist} = \Sigma_{i,l}(\omega_{i,l} * EPE_{i,l}^{OVL} + \alpha_{i,l} * EPE_{i,l}^{POS} + \beta_{i,l} * EPE_{i,l}^{IMG})^{k_{i,l}} \quad (2),$$

$$c_{Max} = \text{Max for Any } i,l|\omega_{i,l} * EPE_{i,l}^{OVL} + \alpha_{i,l} * EPE_{i,l}^{POS} + \beta_{i,l} * EPE_{i,l}^{IMG}| \quad (3),$$

and $$c_{Rng} = \text{Max for Any } i,l(\omega_{i,l} * EPE_{i,l}^{OVL} + \alpha_{i,l} * EPE_{i,l}^{POS} + \beta_{i,l} * EPE_{i,l}^{IMG}) - \text{Min for Any } i,l(\omega_{i,l} * EPE_{i,l}^{OVL} + \alpha_{i,l} * EPE_{i,l}^{POS} + \beta_{i,l} * EPE_{i,l}^{IMG}) \quad (4)$$

Here, Eq. (2) establishes a metric representing the distribution of the edge placement error. It should be used when the patterning process requires control of the pattern edge placement distribution of a population of selected image edges. Stated differently, the cost function expressed by Eq. (2) is applicable when statistical distribution of a large number of image-edges at various locations have to be optimized.

Eq. (3) establishes a metric representing the maximum of the edge placement error, determined over the population of selected edges. It should be used when patterning process requires control over the maximum displacement of the pattern edge within the edge population.

Eq. (4) establishes a metric representing the range of the edge placement errors over the population of selected edges. It should be used when the patterning process requires control over the range of the pattern edge distribution. Generally, cost functions expressed by Eqs. (3) and (4) are applicable when the population of edges is sparse and the imaging performance is limited by a few pattern edges.

In Eqs. (2), (3), and (4):

indices i and/run over the population of chosen edges of images at select locations. Accordingly, different sets of i and l indices establishes the cost functions defined by the choice of edges of images at various locations across the image field;

$\omega_{i,l}$, $\alpha_{i,l}$, $\beta_{i,l}$ and $k_{i,l}$ are location- and edge-specific parameters selected to emphasize the performance of chosen edges at desired locations. These parameters represent "weights" assigned to emphasize chosen edges at chosen locations over other edges in various locations, to achieve flexibility in scanner adjustments with respect to a variety of edge displacements if diverse patterns, some of which depending on particularities may be more critical to the device performance than the others. These parameters can be the same for each edge and location in formulae (2) through (4), or they can be different for various subsets of edges and locations. The choice of these parameters determines a degree to which various pattern edges at the corresponding locations impact the final cost of the optimization. The choice of $\omega_{i,l}$, $\alpha_{i,l}$, $\beta_{i,l}$ and $k_{i,l}$ should be made based on the evaluation of effect of the statistics of the population of edges on the final performance of the integrated device design. For example: a particular cost function might include shifts of left, right, upper and lower edges of a pattern, while the most critical for the design of the integrated device is the placement of upper edges in the center of the image field. To address this situation, $\omega_{i,l}$, $\alpha_{i,l}$, $\beta_{i,l}$ and $k_{i,l}$ for the lth location in the field center and i-th upper edge should have a higher value than the weights corresponding to the rest of the edges at other locations;

the terms (Max for Any i, l) and (Min for Any i, l) stand, respectively, for maximum and minimum "over the population of i-th edges and l-th locations".

Figure 4B:
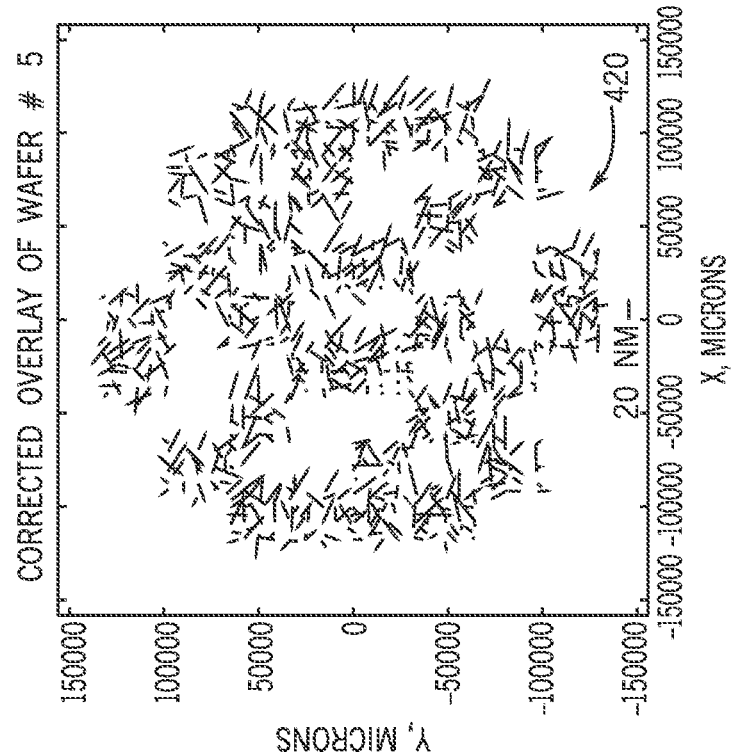
FIGS. 4A, 4B present vector maps of image-pattern shifts caused by overlay performance of a projector at various locations across a patterned wafer. Each red arrow 410 indicates an overlay-driven pattern shift at a corresponding to such arrow location at the patterned wafer.
Figure 4A:
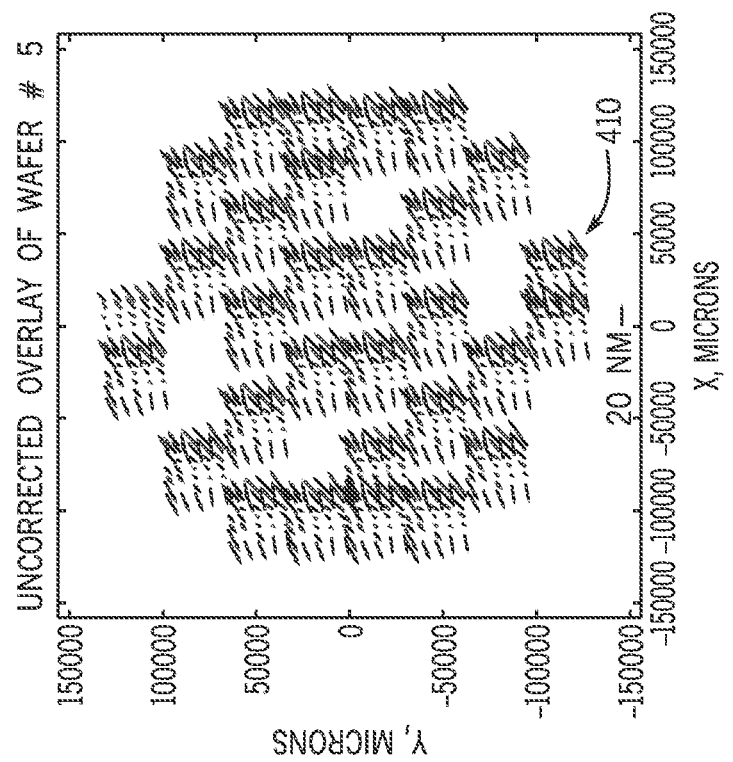

FIGS. 4A, 4B provide illustrations of the overlay performance of a projector by showing vector maps of image-pattern shifts caused by imperfection of such performance at various positions across a patterned wafer. Each arrow 410 indicates an overlay-driven pattern shift at a corresponding to such arrow location at the patterned wafer.

FIG. 4A shows uncorrected pattern displacements, while FIG. 4B shows the pattern displacements after systematic overlay components have been corrected. Such corrections are determined by first exposing a test wafer and analyzing and computing the systematic components of the pattern shifts on this test wafer, as FIG. 4A. These systematic shift components are then used to compute corrections for image placement, which corrections are applied during subsequent exposure of other wafers, thereby leading to corrected overlay shown in FIG. 4B. As the result, the subsequent wafers carry the corrected overlay distribution (the example of which is shown in FIG. 4B). Notably, the corrections determined based on Eqs. (2) through (4) can combine various contributions to edge displacements based on the choice of ω, α, and β. This choice is made by the user who conducts the edge-displacement optimization based on the user's understanding on how various, overlay- and imaging-driven, contributions to edge displacement impact the performance of the final integrated devices. For example, the user of the projector may conclude that the overlay-driven contributions are small in comparison with CD uniformity, and he/she might suppress ω and emphasize β. Under different circumstances, the user might conclude that CD uniformity does not make large contribution to the edge displacement, so he might suppress β, emphasize α, and keep ω at a pre-determined level. Such strategy should be based the knowledge of imaging requirements and performance of any given pattern. It is understood, therefore, that the vectors 420 of FIG. 4B indicate the image-pattern shift that remains not corrected.

Tuning of Projection Optics to Optimize Image-Edge Displacement

Changes to the field curvature of the image field of the projection lens, changes in image field distortions and/or projection lens aberrations cause the changes in placement and shapes of images at various locations in the image field. Therefore, by adjusting the projection lens parameters that affect the projection lens image field curvature, image field distortions and/or the aberrations of the projection lens, the cost-function Eqs. (2) through (4) can be optimized, leading therefore to optimization in image-edge placement error populations. The projection lens adjustments that minimize cost functions expressed by Eqs. (2) through (4) cause optimization of the reticle pattern imaging by the projection lens.

Tuning of Projector Setup to Optimize Pattern Edge Displacements

Modifications of the projection optical system that lead to the optimization of the cost functions (2) through (4) are highly dependent on the particular imaging setup and projector signatures representing illuminator and projection lens characteristics. Therefore, the optimal solutions are, in practice, functions of various scanner attributes, or signatures, representing scanner conditions and setup.

The projector signatures include characteristics such as, for example, optical axis tilts, illuminator flare and polarization errors, shape of the pupil of the projection lens pupil, optical apodization, optical transmission and flare of the projection optics, and scanning synchronization errors.

The projector setup (or projector imaging setup), on the other hand, defines parameters of the illuminator such as, for example, illumination distribution and polarization status, or the numerical aperture of the projection lens.

According to the idea of the invention, the projector signatures and imaging setup are tuned with the purpose of minimizing the cost functions (such as those expressed by Eqs. 2 through 4, for example) to optimize the across-the-image-field image edge placement errors.

Figure 10A:
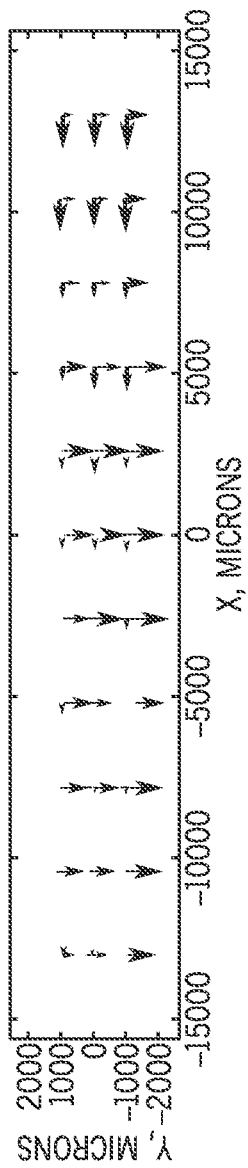
FIGS. 10A, 10B, 10C, 10D illustrate edge shifts images of dense contact hole patterns at 33 locations across the image field. The horizontal arrows show the shifts of vertical left and right edges (in this case, both edges shifted the same way). Vertical arrows show the shifts of horizontal lower and upper edges (both edges shifted the same way).
Figure 10B:
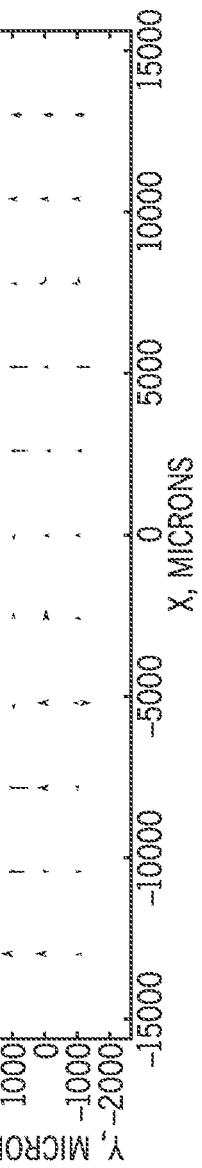
Figure 10C:
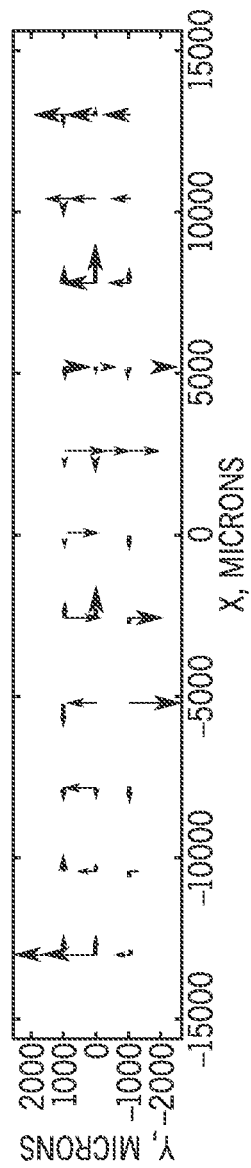
Figure 10D:
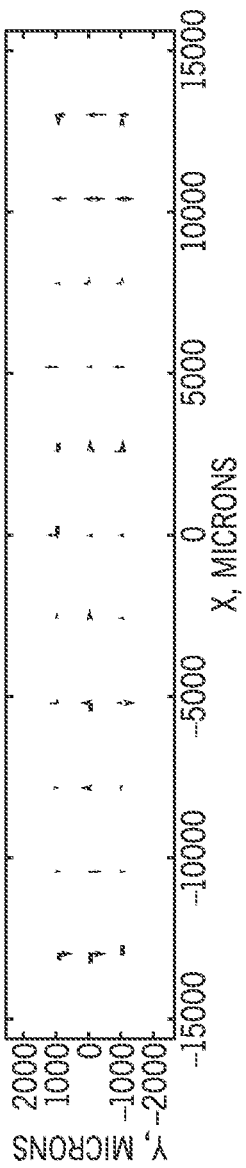
Figure 11A:
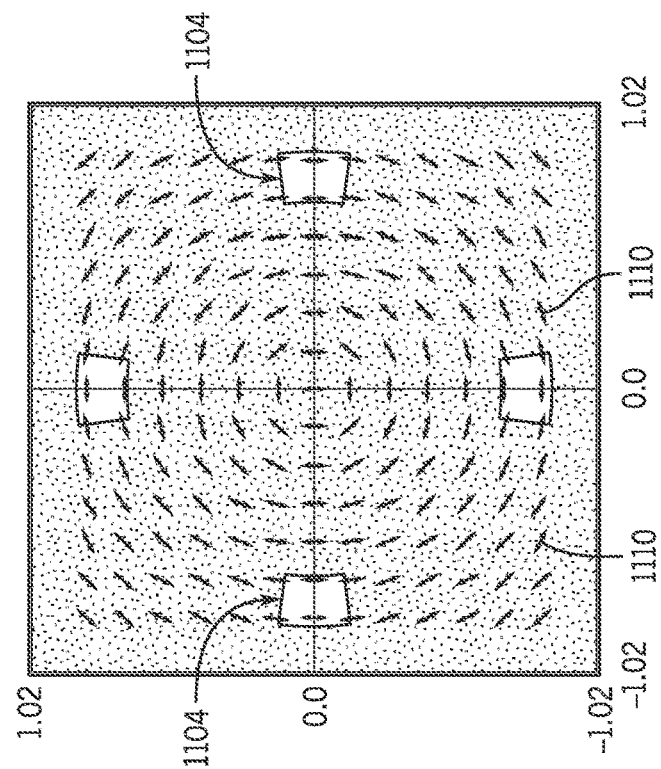
FIGS. 11A, 11B present distributions of light at the illuminator exit pupil, which illustrates properties of two settings of the illuminator, observed at one of the principle planes of the projector. The distribution of FIG. 11A corresponds to the case of a windmill illuminator, while the distribution of FIG. 11B corresponds to a cross quadrupole illuminator. The bright segment areas 1104 in the graphs represents the segments in the illuminator pupil from which light is propagating towards the reticle. The grey arrows 1110 mark the azimuthal polarization of the illumination radiation.
Figure 11B:
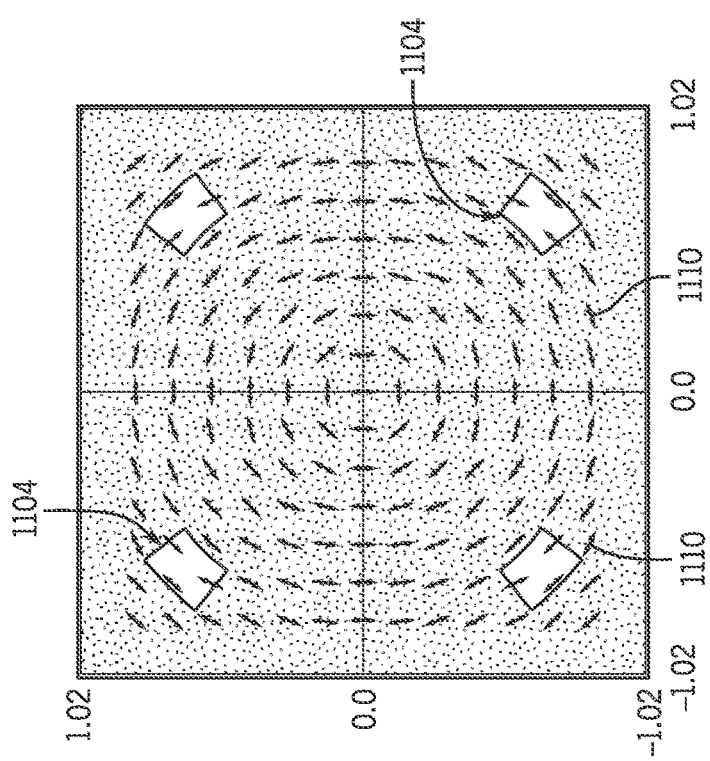

FIGS. 9A, 9B, 9C, 10A, 10B, 10C, 10D, 11A, and 11B provide examples of operation of the embodiment of the invention, leading to the optimized edge placement distributions. Here, the edge distribution optimum shown in FIG. 9B was obtained by minimizing cost function of Eq. (4). The cost function of Eq. (4), representing the range of the edge shifts, for edge distribution in FIG. 9B was reduced by 12% relative to the cost function of Eq. (4) for edge distribution of FIG. 9A. At the same time, the maximum edge displacement, represented by cost function of Eq. (3) in FIG. 9B increased by 8% relative to the cost maximum edge displacement shown in FIG. 9A. The projector tuning that resulted in edge placement improvement shown in FIG. 9B involved image field shift of 0.35 nm and tuning of the image field distortion via field magnification in y-direction by 0.015 parts per million and field rotation by −0.24 parts per million;

the edge distribution optimum shown in FIG. 9C was obtained by minimizing cost function of Eq. (3). The cost function of Eq. (3), representing the maximum edge displacement, for edge distribution of FIG. 9C was reduced by 3% relative to the cost function of Eq. (3) for the edge distribution of FIG. 9A, and it was reduced by 11% relative to the cost function of Eq. (3) for the distribution of edges shown in FIG. 9B. The projector tuning that resulted in improvement of edge placement shown in FIG. 9C involved shifting the image field by 0.05 nm, and tuning of the image field distortion via field magnification in y direction by 0.015 parts per million and field rotation by −0.24 parts per million;

the edge distribution optimum shown in FIGS. 10B and 10C was obtained by minimizing cost function of Eq. (2). The cost function of Eq. (2), representing distribution standard deviation of edges in FIGS. 10B and 10C, was reduced by 61% for vertical edges and by 7% for horizontal edges, relative to the cost function of Eq. (2) for distribution of the corresponding edges in FIG. 10A. The projector tuning that resulted in improvement of the edge placement shown in FIGS. 10B and 10C involved tuning of the image field distortion via field magnification change in x and y directions by 0.5 parts per million and by 0.09 ppm respectively, field orthogonality/rotation change by −0.49 parts per million, and field rotation by 1.1 parts per million;

the edge distribution optimum shown in FIG. 10D was obtained by minimizing cost function of Eq. (2). The cost function of Eq. (2), representing distribution standard deviation of edges in FIG. 10D, was reduced by 86% for vertical edges and by 72% for horizontal edges relative to the cost function of Eq. (2) for distribution of corresponding edges in FIG. 10A. The projector tuning that resulted in improvement of the edge placement shown in FIG. 10D involved changing the illuminator setup from the one shown in FIG. 11A to the one shown in FIG. 11 B, as well as tuning of the image field distortion via field magnification change in x- and y-directions by −0.34 parts per million and by 0.05 parts per million respectively, field orthogonality/rotation change by 0.143 parts per million, and field rotation by −0.58 parts per million;

Particularly, in one example shown in FIGS. 10A, 10B, 10C, 10D in reference to FIGS. 11A, 11B, the illuminator setup is adjusted to alter the illumination layout, and/or polarization of light delivered to the mask, and/or illumination flare. Note the difference in the location of the bright illuminator pupil segments from which the light illumination the reticle emerges (FIG. 11 *a* shows windmill layout, FIG. 11B shows cross layout of the illumination poles). The result of tuning or modifying the illumination setup from the pattern of FIG. 11A to that of FIG. 11B, the change in the pattern edge locations was achieved from the ones shown in FIGS. 10 B, 10C to the ones shown in FIG. 10D. A skilled artisan will readily appreciate that the use of the illuminator distribution according to that of FIG. 11 B minimizes the pattern edge displacements and minimizes both of cost functions of Eq. (2) and Eq. (3).

Alternatively or in addition, the numerical aperture of the projection lens can be modified to alter the lens attributes such as flare, apodization and/or projection pupil aberrations.

In another related implementation, when projector is of the scanner type, the synchronization of scanning of the reticle and scanning of the wafer can be adjusted to modify scan synchronization errors. This latter adjustment will impact the sensitivity of $EPE_{i,j}$ (as defined by Eq. (1)) to the adjustments of field curvature, field distortions and projection lens aberrations.

Additional or alternative optimization of the cost functions of Eqs. (2) through (4) and the overall edge-placement error is achieved as a result of modifications introduced to the scanner setup with a proviso that such modifications or tuning may cause the variations of key imaging performance metrics (such as image depth of focus, DOF; exposure latitude or EL; and mask error enhancement factor, MEEF). DOF defines allowed imaging defocus range over which pattern CDs meet the tolerance requirements, EL is the exposure level variation over which the pattern CDs meet the tolerance requirements. MEEF is the ratio of image dimension change to the mask dimension change causing the image change. To deliver the imaging of the mask onto the image plane with practically-acceptable quality, the DOF and EL must be larger than minima defined by the integrated device requirements. The DOF and EL minima and MEEF maxima are defined by the imaging process engineer in accordance with the requirements of given device-manufacturing process. For example, the degree of flatness of a wafer might impose a "minimum DOF" requirement. In practice, therefore, it may be preferred to minimize the image-edge-placement errors by altering the projector signature, the imaging setup, the image field curvature and distortion and projection lens aberrations, while simultaneously verifying that for each new projector signature and imaging setup, the imaging metrics, such as DOF, EL, MEEF, do not violate the imposed constraints. In other words, a co-optimization approach involving cost functions (2) through (4) and these additional imaging metrics is required.

By adjusting the scanner imaging setup and signatures that can be carried in real time and combined with the adjustment(s) to projection lens field curvature, image field distortions and projection lens aberrations, the cost functions of Eqs. (2) through (4) can be optimized leading to optimized mask-pattern imaging.

It is appreciated, therefore, that embodiments of the invention facilitate and enable modifications and tangible adjustments to the hardware of a projection lens and a scanner setup to:
 a) control placement of image edges across various locations in the image field;
 b) accomplish desired distribution of image edges at various locations in the image field;
 c) minimize image edge displacements at various locations in the image field;
 d) minimize the range of image edge displacements at various locations in the image field;
 e) accomplish desired imaging performance in terms of image edge placement, image depth of focus, process latitude, mask enhancement errors at various locations in the image field under various imaging conditions;
 f) match the image dimensions and placement produced by one imaging tool with the image dimensions and placements of other tools;
 g) Control locations and distributions of the image edges across various locations in the image field;
 h) Minimize pattern edge displacements that are difficult to measure directly;
 i) Co-optimize the edge locations, depth of focus, imaging latitude, and mask enhancement errors of images under customized imaging conditions;
 j) Co-optimize image edge locations, depth of focus, process latitude, and mask enhancement errors specific to imaging setup defined by the illumination and projection conditions.

In a related implementation, when projector is of a scanner type, the synchronization of the scanning of the reticle and the scanning of the wafer (see FIG. 3B) can be also modified or adjusted to reduce scan synchronization errors. This latter adjustment will impact the sensitivity of $EPE_{i,j}$ (as defined by Eq. (1)) to the adjustments of field curvature, field distortions and projection lens aberrations.

As such, implementing the intra-field corrections requires a tuning of various subsystems. The corrections reflected in FIGS. 10A, 10B, 10C, 10D were found by analyzing the impact of the projector setup, projector signature and projection aberration on pattern placement. This analysis was part of the optimization sequence involving tuning of the projector setup, scanner and aberrations optimize one of the cost functions of Eqs. (2) through (4). As the result of this analysis, optima for the projection setup, signature and aberrations were found within the projector adjustment space, determined by the adjustments available within the projection tool (in that sense the optimization process is specific to a given projection tool).

References throughout this specification to "one embodiment," "an embodiment," "a related embodiment," or similar language mean that a particular feature, structure, or characteristic described in connection with the referred to "embodiment" is included in at least one embodiment of the present invention. Thus, appearances of the phrases "in one embodiment," "in an embodiment," and similar language throughout this specification may, but do not necessarily, all refer to the same embodiment. It is to be understood that no portion of disclosure, taken on its own and in possible connection with a figure, is intended to provide a complete description of all features of the invention.

Within this specification, embodiments have been described in a way that enables a clear and concise specification to be written, but it is intended and will be appreciated that embodiments may be variously combined or separated without parting from the scope of the invention. In particular, it will be appreciated that each of the features described herein is applicable to most if not all aspects of the invention.

In addition, when the present disclosure describes features of the invention with reference to corresponding drawings (in which like numbers represent the same or similar elements, wherever possible), the depicted structural elements are generally not to scale, for purposes of emphasis and understanding. It is to be understood that no single drawing is intended to support a complete description of all features of the invention. In other words, a given drawing is generally descriptive of only some, and not necessarily all, features of the invention. A given drawing and an associated portion of the disclosure containing a description referencing such drawing do not, generally, contain all elements of a particular view or all features that can be presented is this view, at least for purposes of simplifying the given drawing and discussion, and directing the discussion to particular elements that are featured in this drawing. A skilled artisan will recognize that the invention may possibly be practiced without one or more of the specific features, elements, components, structures, details, or characteristics, or with the use of other methods, components, materials, and so forth. Therefore, although a particular detail of an embodiment of the invention may not be necessarily shown in each and every drawing describing such embodiment, the presence of this particular detail in the drawing may be implied unless the context of the description requires otherwise. The described single features, structures, or characteristics of the invention may be combined in any suitable manner in one or more further embodiments.

The invention as recited in claims appended to this disclosure is intended to be assessed in light of the disclosure as a whole, including features disclosed in prior art to which reference is made.

For the purposes of this disclosure and the appended claims, the use of the terms "substantially", "approximately", "about" and similar terms in reference to a descriptor of a value, element, property or characteristic at hand is intended to emphasize that the value, element, property, or characteristic referred to, while not necessarily being exactly as stated, would nevertheless be considered, for practical purposes, as stated by a person of skill in the art. These terms, as applied to a specified characteristic or quality descriptor means "mostly", "mainly", "considerably", "by and large", "essentially", "to great or significant extent", "largely but not necessarily wholly the same" such as to reasonably denote language of approximation and describe the specified characteristic or descriptor so that its scope would be understood by a person of ordinary skill in the art. In one specific case, the terms "approximately", "substantially", and "about", when used in reference to a numerical value, represent a range of plus or minus 20% with respect to the specified value, more preferably plus or minus 10%, even more preferably plus or minus 5%, most preferably plus or minus 2% with respect to the specified value. As a non-limiting example, two values being "substantially equal" to one another implies that the difference between the two values may be within the range of +/−20% of the value itself, preferably within the +/−10% range of the value itself, more preferably within the range of +/−5% of the value itself, and even more preferably within the range of +/−2% or less of the value itself.

The use of these terms in describing a chosen characteristic or concept neither implies nor provides any basis for indefiniteness and for adding a numerical limitation to the specified characteristic or descriptor. As understood by a skilled artisan, the practical deviation of the exact value or characteristic of such value, element, or property from that stated falls and may vary within a numerical range defined by an experimental measurement error that is typical when using a measurement method accepted in the art for such purposes.

Disclosed aspects, or portions of these aspects, may be combined in ways not listed above. Changes may be made without departing from the scope of the invention. In view of the numerous possible embodiments to which the principles of the disclosed invention may be applied, the invention should not be viewed as being limited to the disclosed example.

What is claimed is:

1. A computer-program product encoded in a non-transitory tangible computer-readable storage medium, said computer-program product being usable with a programmable processor to predict and monitor a position of an edge of an image of a reticle pattern formed on a workpiece in a lithographic exposure process carried out with an exposure tool, the computer-program product comprising computer-readable code that, when loaded on the programmable processor, causes said programmable processor to effectuate a) performing at least one wafer-exposure run in the exposure tool
   to form a first image of the reticle pattern on the workpiece, and
   to determine, with the use of an optical detector of the exposure tool, first and second operational factors, the first operational factors representing parameters of operation of said exposure tool and including descriptors of optical imaging in said exposure tool, the second operational factors representing a shot-overlay characteristic of said exposure tool,
   wherein the first image is characterized by a first difference between a position of an edge of the first image and a target position;

b) determining, with a computer device, a change of the position of the edge of the first image with respect to the target position based on said first operational factors and said second operational factors; and c) based on a value of the determined change of the position, modifying the exposure tool by changing one or more of presence, position, orientation, size, and shape of an optical component of the optical projection system to form a second image of the reticle pattern on the workpiece, the second image characterized by a second difference between a position of an edge of the second image and the target position, the second difference being smaller than the first difference.

2. The computer-program product according to claim 1, wherein said computer-readable code is configured to cause the programmable processor to determine said descriptors of optical imaging as functions of a position across a scanner slit of said exposure tool, said descriptors of optical imaging including (i) deviations of a surface of best focus of irradiance distribution of said first image from a surface of the workpiece and (ii) an exposure dose.

3. The computer-program product according to claim 1, wherein said computer-readable code is configured to cause the programmable processor to effectuate defining first relationships among an image defocus, an exposure dose, and critical dimensions of said first image at the workpiece.

4. The computer-program product according to claim 3, wherein said defining the first relationships includes defining said first relationships at plural different locations of a scanner slit of said exposure tool.

5. The computer-program product according to claim 3, containing computer-readable code that, when loaded on the programmable processor, is configured to cause the programmable processor
   to calculate said critical dimensions based on said first relationships, the image defocus, and the exposure dose;
   to apply a blur correction based on at least one of defocus data and scan synchronization data generated by said exposure tool; and
   to compare the calculated critical dimensions with target critical dimensions corresponding to a design specification.

6. The computer-program product according to claim 1, wherein said computer-readable code is configured to cause the programmable processor to effectuate defining second relationships among an image defocus, an exposure dose, and a value of a lateral shift of said first image at the workpiece.

7. The computer-program product according to claim 6, wherein said defining the second relationships includes defining said second relationships at plural different locations of a scanner slit of said exposure tool.

8. The computer-program product according to claim 6, wherein said computer-readable code is configured to cause the programmable processor to calculate said value of the lateral shift based on said second relationships, the image defocus, and the exposure dose.

9. The computer-program product according to claim 1, comprising computer-readable code which, when loaded on the programmable processor, causes said programmable processor to effectuate creating at least one of a defocus map and a dose map.

10. The computer-program product according to claim 9, wherein said creating includes creating the dose map based on dose integrator data.

11. The computer-program product according to claim 9, wherein said creating includes creating the defocus map based on data including at least one of (i) data acquired with the use of an interferometer of the exposure tool, (ii) total field deviation data, and (iii) focus correction data.

12. The computer-program product according to claim 9, wherein said creating includes creating the defocus map based on a vector sum of topography target errors, stage trajectory errors, and image plane excursions.

13. The computer-program product according to claim 1, containing computer-readable program code which, when loaded on the programmable processor, causes the programmable processor to effectuate creating a map of image displacement values across the workpiece, said map representing values of image shift, which values have been determined as a function of locations across the workpiece based at least on the first and the second operational factors.

14. The computer-program product according to claim 13, wherein said creating the map of the image displacement values includes applying a blur correction based on at least one of defocus data and scan synchronization data generated by said exposure tool.

15. The computer-program product according to claim 1, wherein said determining is performed in-situ during an exposure step of the lithographic exposure process with said exposure tool.

16. The computer-program product according to claim 1, wherein said determining includes creating, in a computer process, a map of positions of edges of said first image across the workpiece.

17. The computer-program product according to claim 1, wherein said modifying includes changing a process of synchronization of relative scanning between the workpiece and a component of the exposure tool to reduce a contribution of a scanning synchronization error to said first difference.

18. A computer-program product for assessment of an edge position of a pattern image formed on the substrate by an exposure apparatus, the computer-program product comprising a computer-usable tangible non-transitory storage medium having computer-readable program code thereon, the computer-readable program code including program code for effectuating processing steps that include:
   preparing information representing a state of the exposure apparatus during operation of the exposure apparatus; and
   determining the edge position of the pattern image with the use of the information representing the state of the exposure apparatus,
   wherein the information representing the state of the exposure apparatus includes data representing a scanning synchronization error of said exposure apparatus.

19. The computer-program product according to claim 18, wherein said preparing the information representing the state of the exposure apparatus includes acquiring, from an optical detector of the exposure apparatus, first information containing a signal produced by the optical detector during the operation of the exposure apparatus.

20. The computer-program product according to claim 19, wherein said preparing includes acquiring the first information that includes data representing a dose of exposure of the substrate during the operation of the exposure apparatus.

21. The computer-program product according to claim 19, wherein said preparing includes acquiring the first information that includes data representing a position of a focus of radiation, to which the substrate is exposed during the operation of the exposure apparatus.

22. The computer-program product according to claim 18, wherein said preparing the information representing the state of the exposure apparatus includes processing, with a controller of the exposure apparatus, second information that contains a control signal of the exposure apparatus during the operation of the exposure apparatus.

23. The computer-program product according to claim 18, wherein the computer-readable program code includes
   program code for preparing third information representing a change in the edge position of the pattern image with respect to a change in the state of the exposure apparatus,
   and wherein the determining includes calculating the edge position of the pattern image using at least the information representing the state of the exposure apparatus and the third information.

24. The computer-program product according to claim 22,
   wherein the calculating includes correcting the edge position of the pattern image,
   wherein the edge position of the pattern image has been calculated based on the information representing the state of the exposure apparatus with the use of the third information.

25. The computer-program product according to claim 18, further comprising computer-readable program code to perform additional processing steps that include
   determining the edge position of the pattern image as a result of said effectuating the processing steps.

26. The computer-program product according to claim 25, further comprising computer-readable program code for
   determining, with the use of a sensor of the exposure apparatus, whether the edge position of the pattern image falls within a predetermined range of positions, and
   generating, with a controller of the exposure apparatus, a warning signal when the edge position of the pattern image falls outside of said predetermined range of positions.

27. The computer-program product according to claim 18, comprising computer-readable program code which, when loaded on a programmable computer process operably cooperated with the exposure apparatus, causes the exposure apparatus to effectuate
   exposing the pattern image on the substrate while performing determining the edge position of the pattern image as a result of said effectuating the processing steps;

developing the substrate after said exposing to form a mask layer having a contour corresponding to the pattern image; and processing a surface of the substrate through the mask layer.

* * * * *